(12) United States Patent
Chi et al.

(10) Patent No.: US 8,815,659 B2
(45) Date of Patent: Aug. 26, 2014

(54) METHODS OF FORMING A FINFET SEMICONDUCTOR DEVICE BY PERFORMING AN EPITAXIAL GROWTH PROCESS

(71) Applicant: GLOBALFOUNDRIES Inc., Grand Cayman, KY (US)

(72) Inventors: Min-hwa Chi, Malta, NY (US); Nam Sung Kim, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/716,686

(22) Filed: Dec. 17, 2012

(65) Prior Publication Data

US 2014/0167120 A1 Jun. 19, 2014

(51) Int. Cl.
H01L 21/84 (2006.01)
H01L 29/66 (2006.01)
H01L 29/78 (2006.01)

(52) U.S. Cl.
CPC ........ H01L 29/66795 (2013.01); H01L 29/785 (2013.01)
USPC ..................... 438/157; 438/283; 257/E21.637

(58) Field of Classification Search
USPC .................. 438/157, 176, 283; 257/E21.623, 257/E21.637
See application file for complete search history.

(56) References Cited

U.S. PATENT DOCUMENTS 7,235,468 B1 * 6/2007 Mouli ........................... 438/514
7,655,534 B2 2/2010 Sheen et al.
2011/0101421 A1 5/2011 Xu

OTHER PUBLICATIONS

Ahmed & Schuegraf, "Transistor Wars—Rival Architectures Face Off in a Bid to Keep Moore's Law Alive," IEEE Spectrum, pp. 50-53, 63-66, Nov. 2011.
Fujita et al., "Advanced Channel Engineering Achieving Aggressive Reduction of Vt Variation for Ultra-Low-Power Applications," IEEE, IEDM11-749-752, 2011.
Grossar et al., "Read Stability and Write-Ability Analysis of SRAM Cells for Nanometer Technologies," IEEE Journal of Solid-State Circuits, 41:2577-88, Nov. 2006.
Hokazono et al., "Steep Channel Profiles in n/pMOS Controlled by Boron-doped Si:C Layers for Continual Bulk—CMOS Scaling," IEEE, IEDM09-673-676, 2009.
Nowak et al., "Turning Silicon on its Edge—Overcoming silicon scaling barriers with double-gate and FinFET technology," IEEE Circuits & Devices Magazine, pp. 20-31, Jan./Feb. 2004.
Redolfi et al., "Bulk FinFET Fabrication with New Approaches for Oxide Topography Control Using Dry Removal Techniques".

* cited by examiner

Primary Examiner — Thanhha Pham
(74) Attorney, Agent, or Firm — Amerson Law Firm, PLLC

(57) ABSTRACT

A method of forming a FinFET device involves performing an epitaxial growth process to form a layer of semiconducting material on a semiconducting substrate, wherein a first portion of the layer of semiconducting material will become a fin structure for the FinFET device and wherein a plurality of second portions of the layer of semiconducting material will become source/drain structures of the FinFET device, forming a gate insulation layer around at least a portion of the fin structure and forming a gate electrode above the gate insulation layer.

28 Claims, 23 Drawing Sheets

View X-X

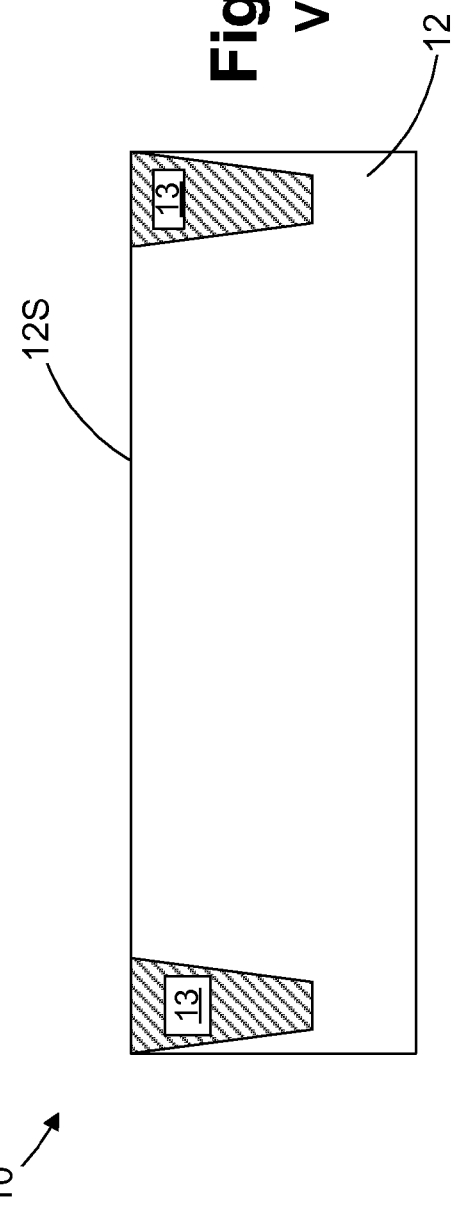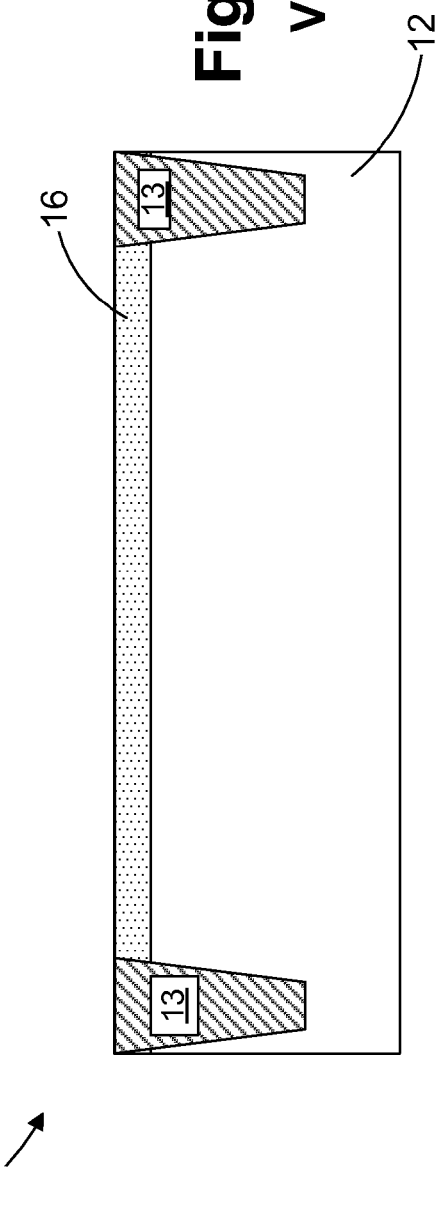

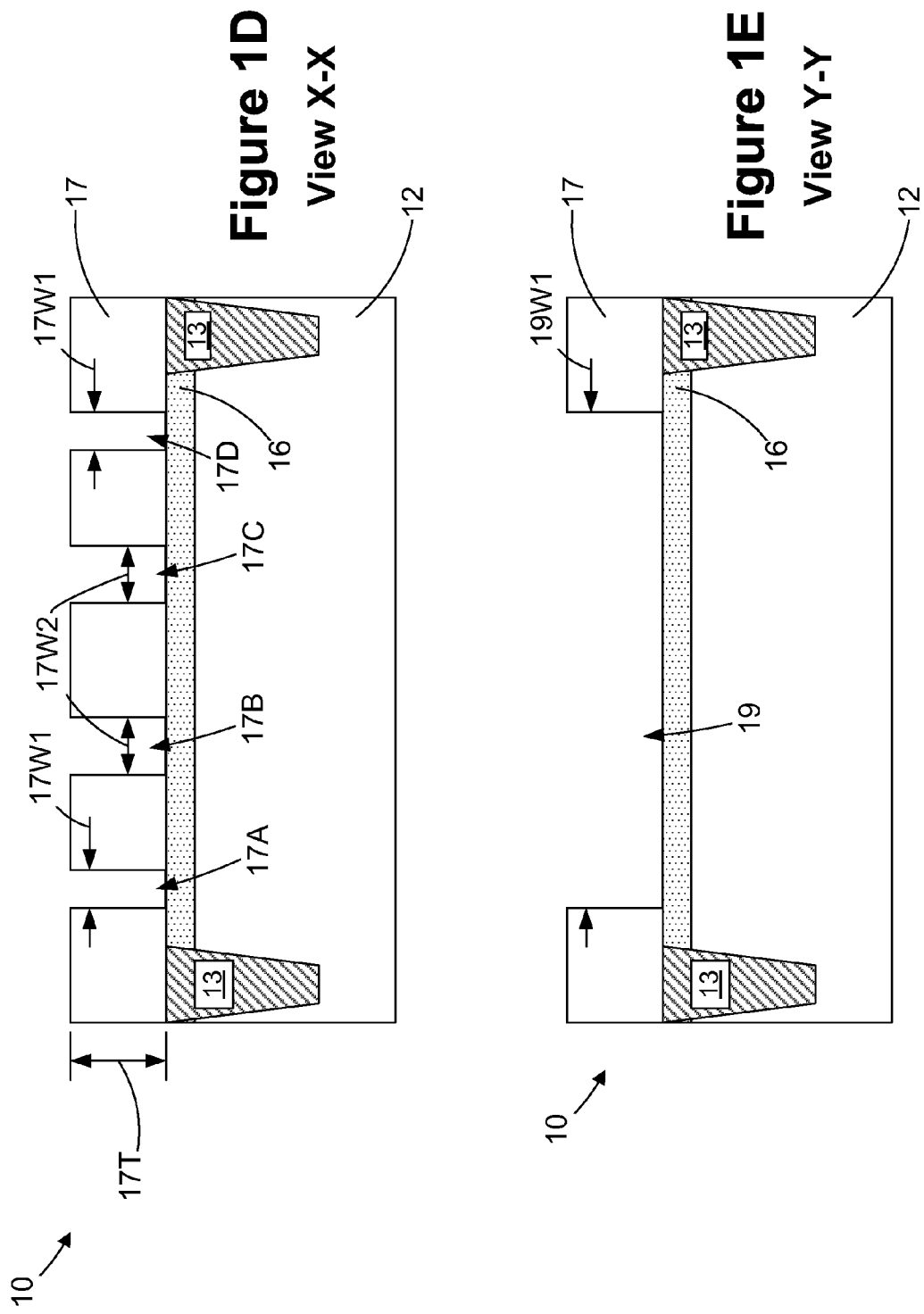

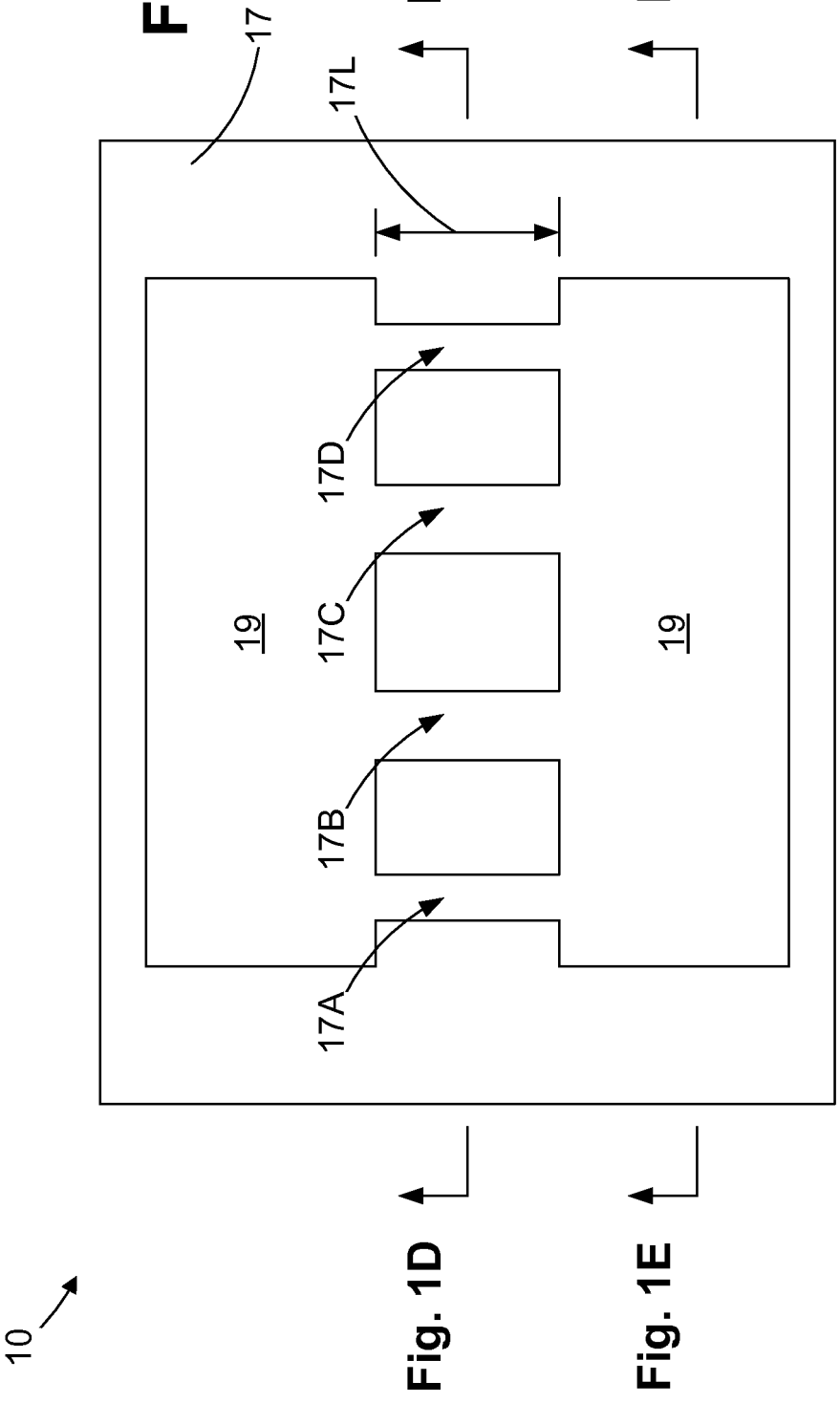

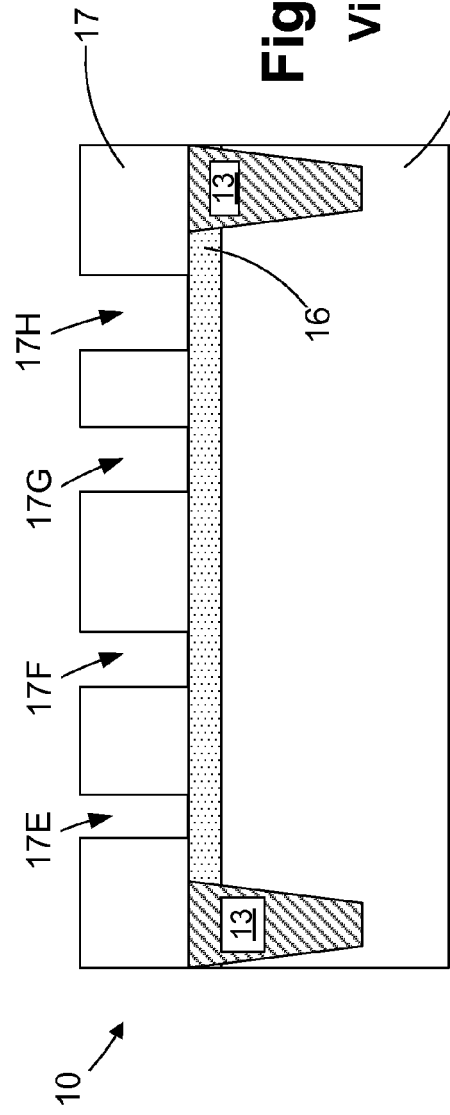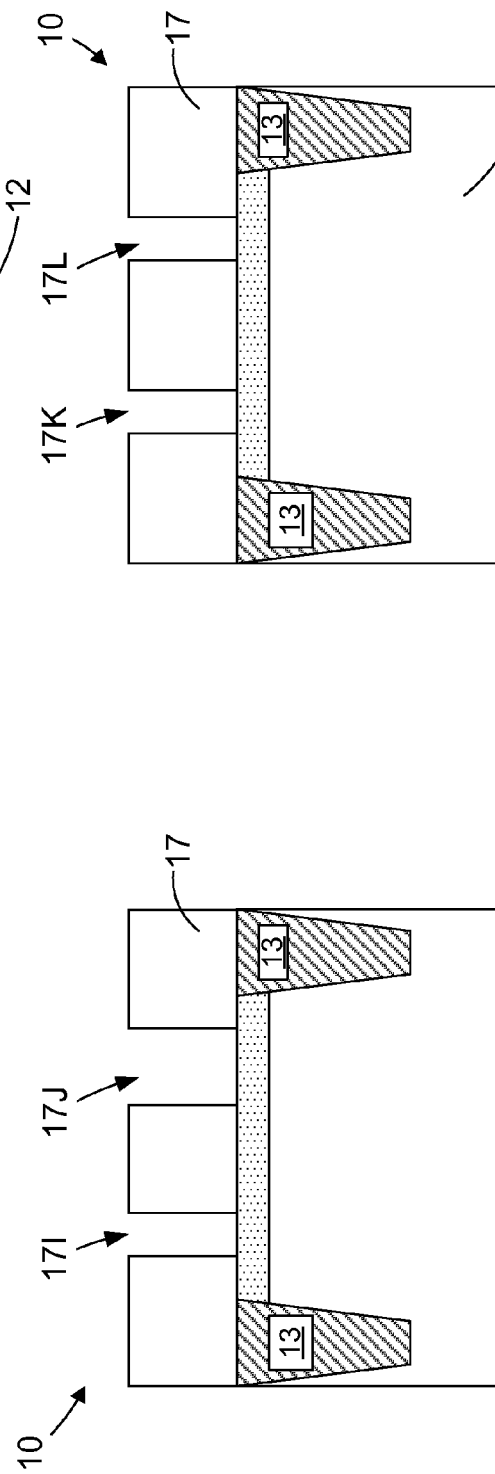

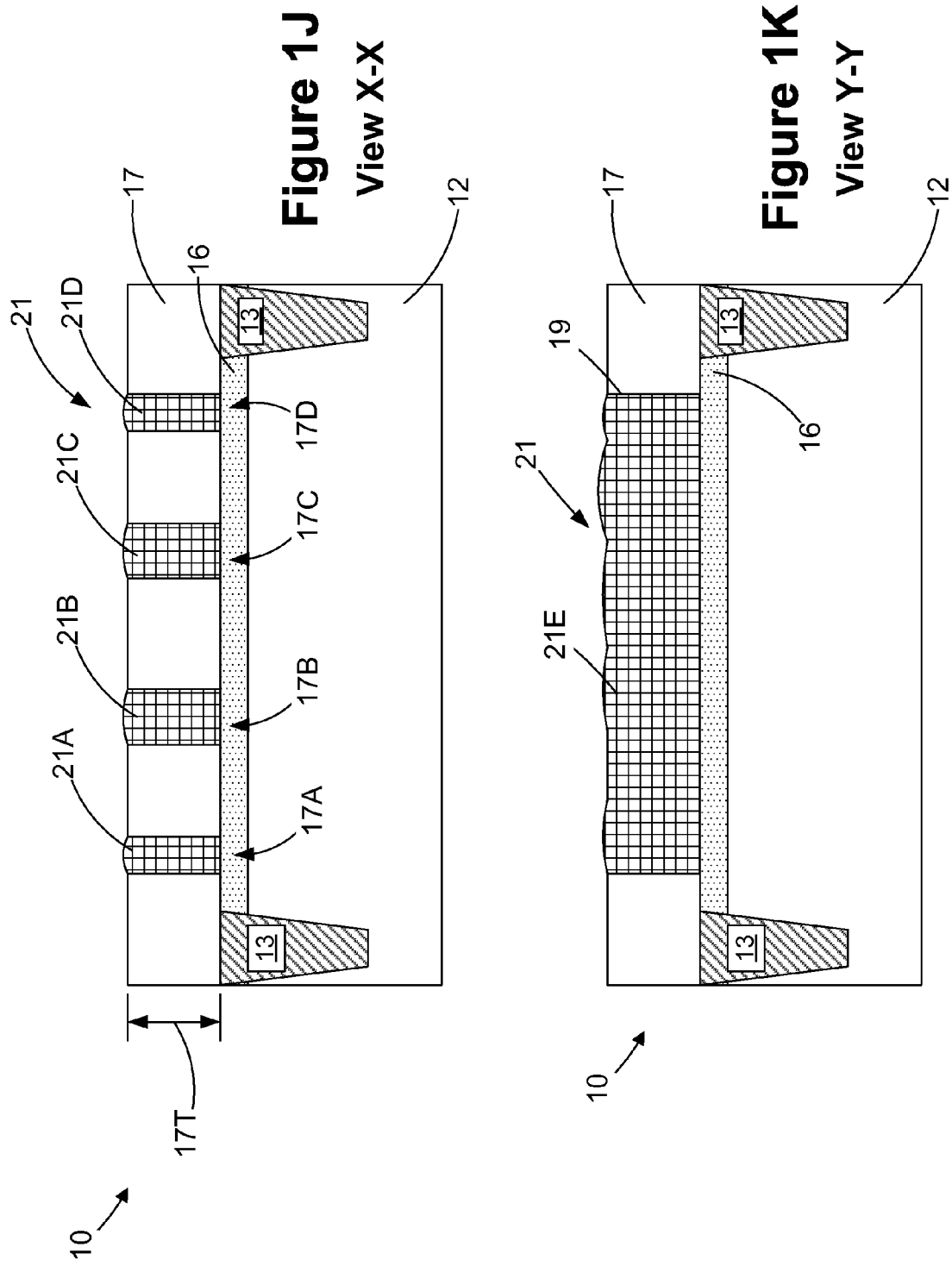

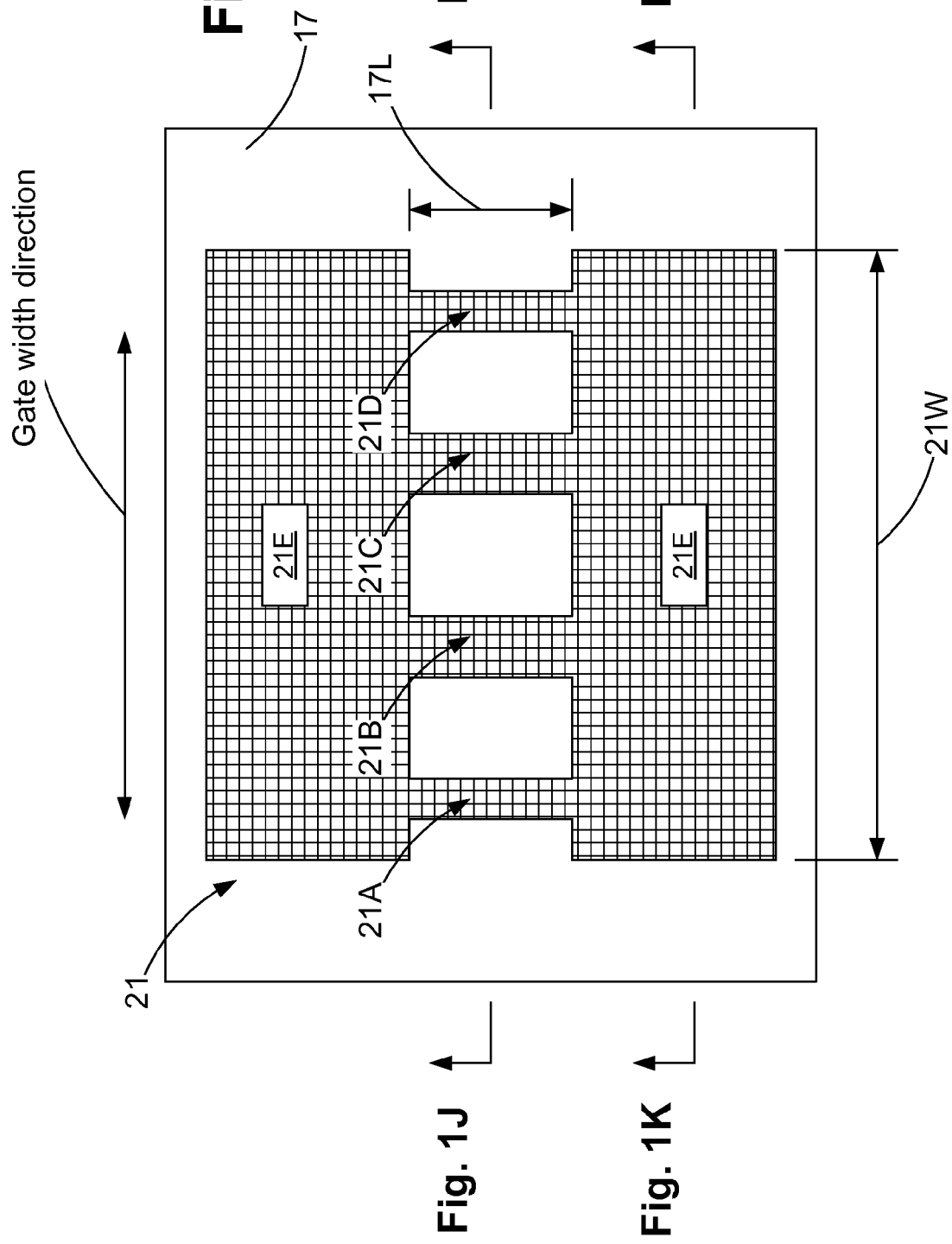

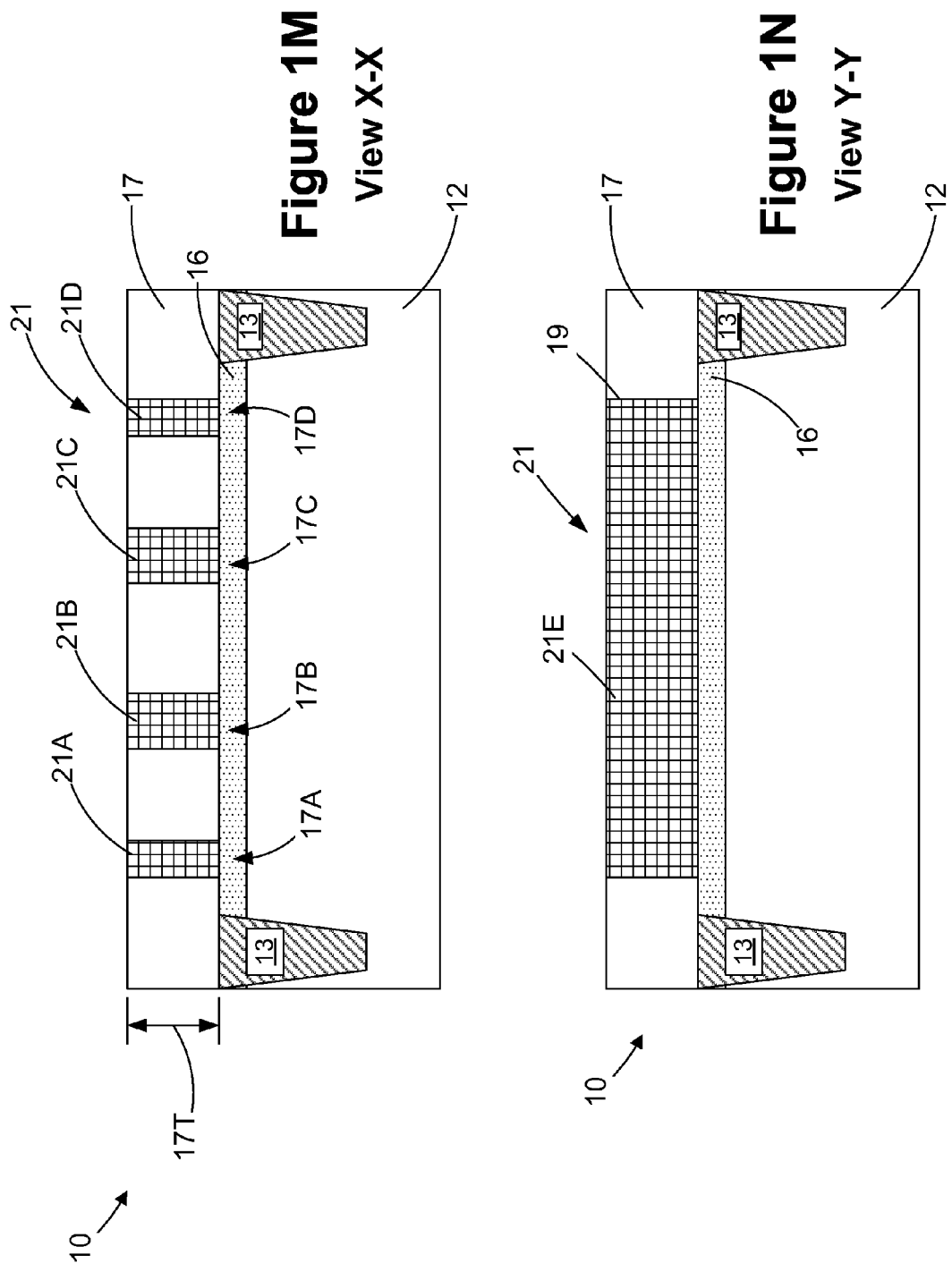

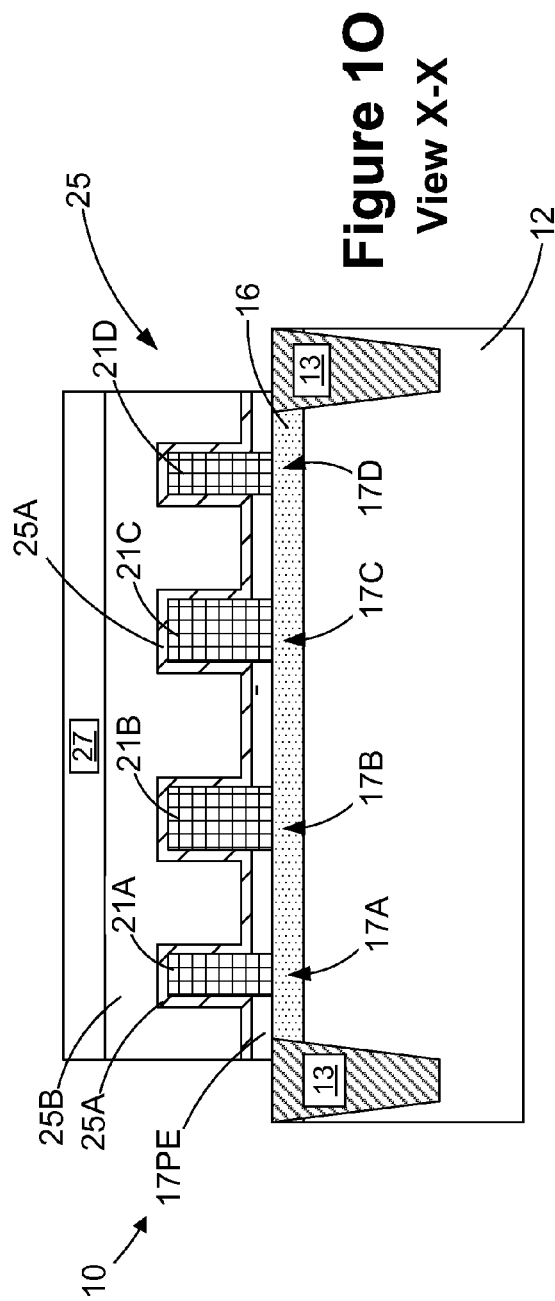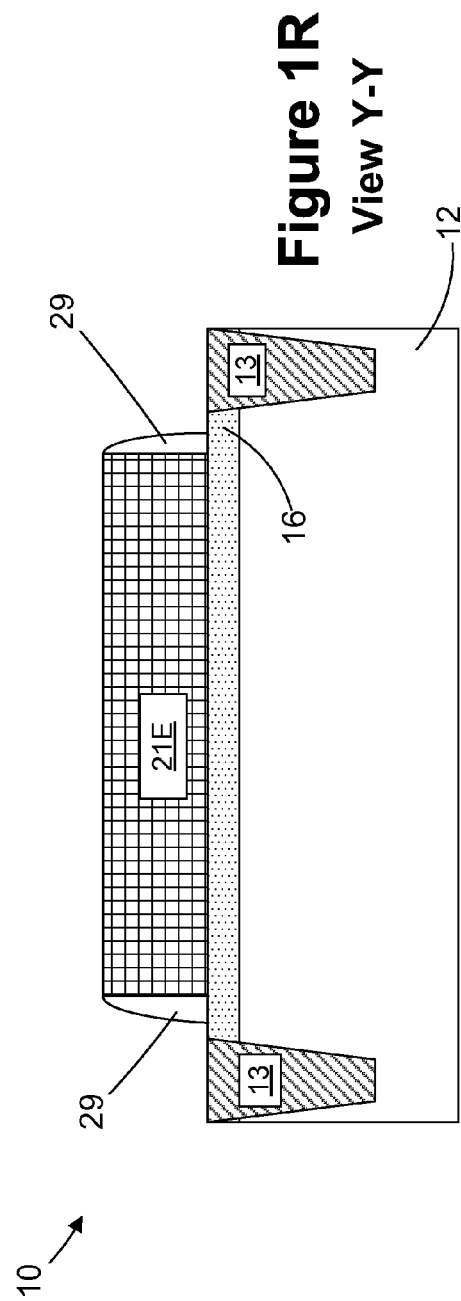

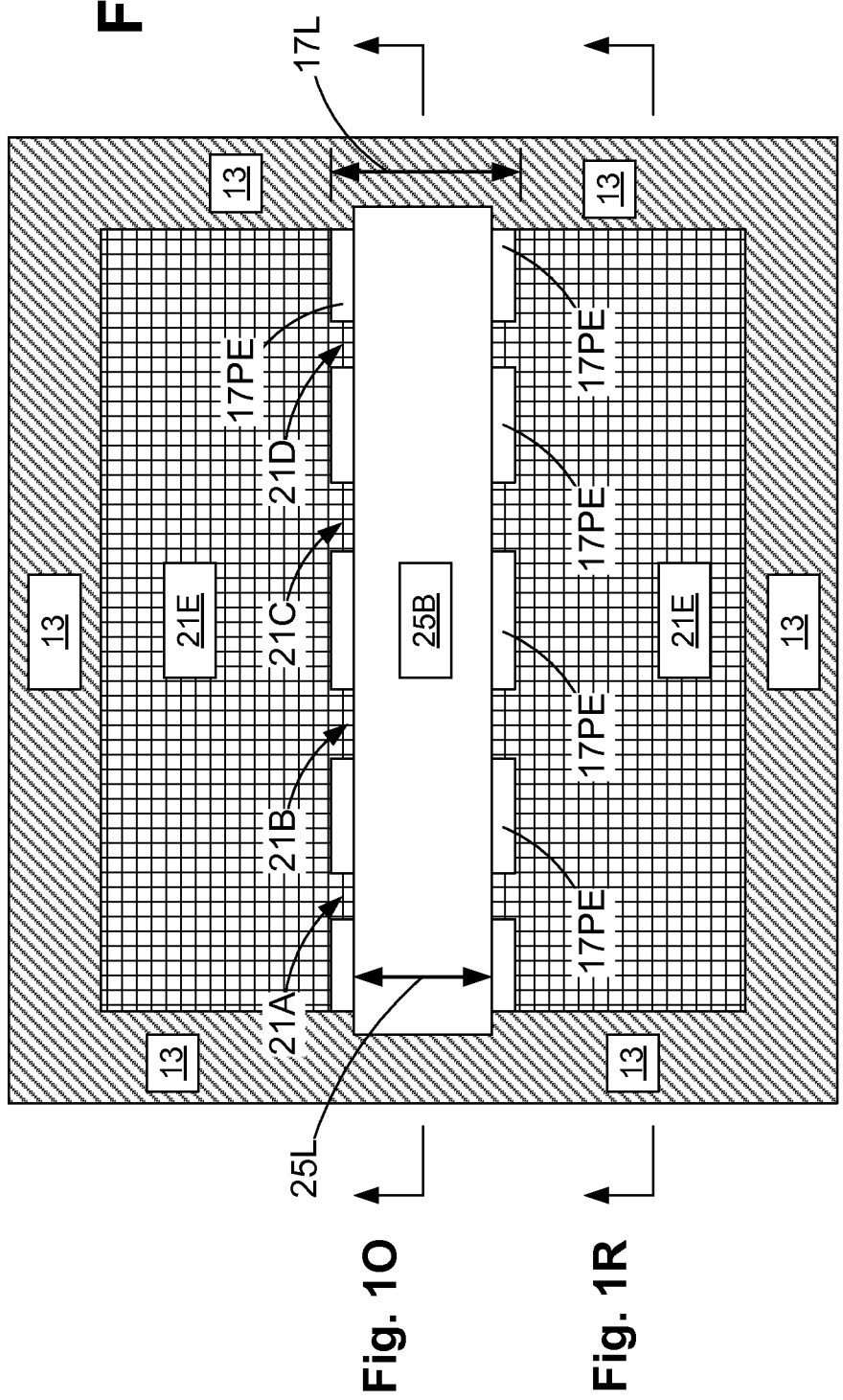

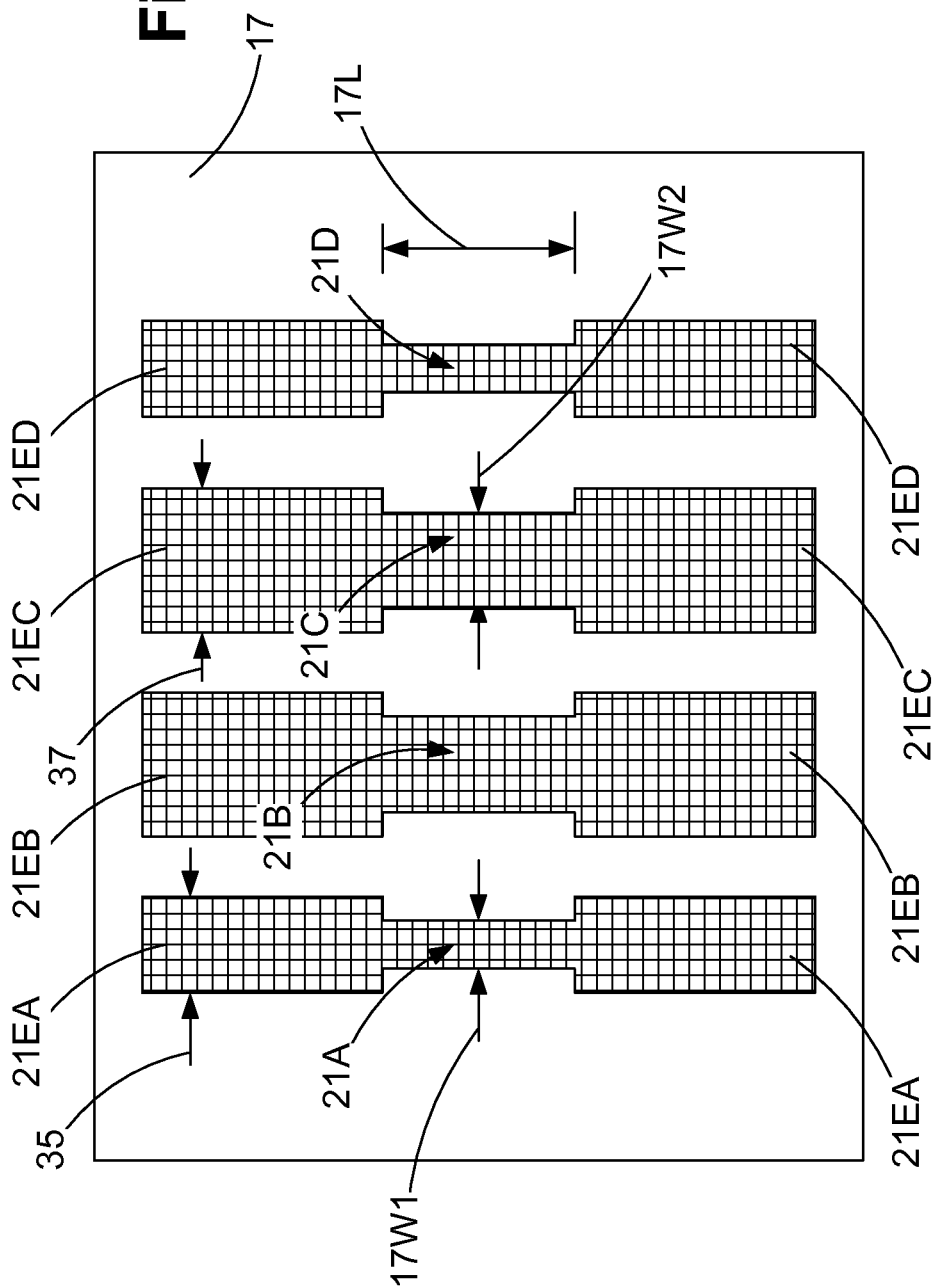

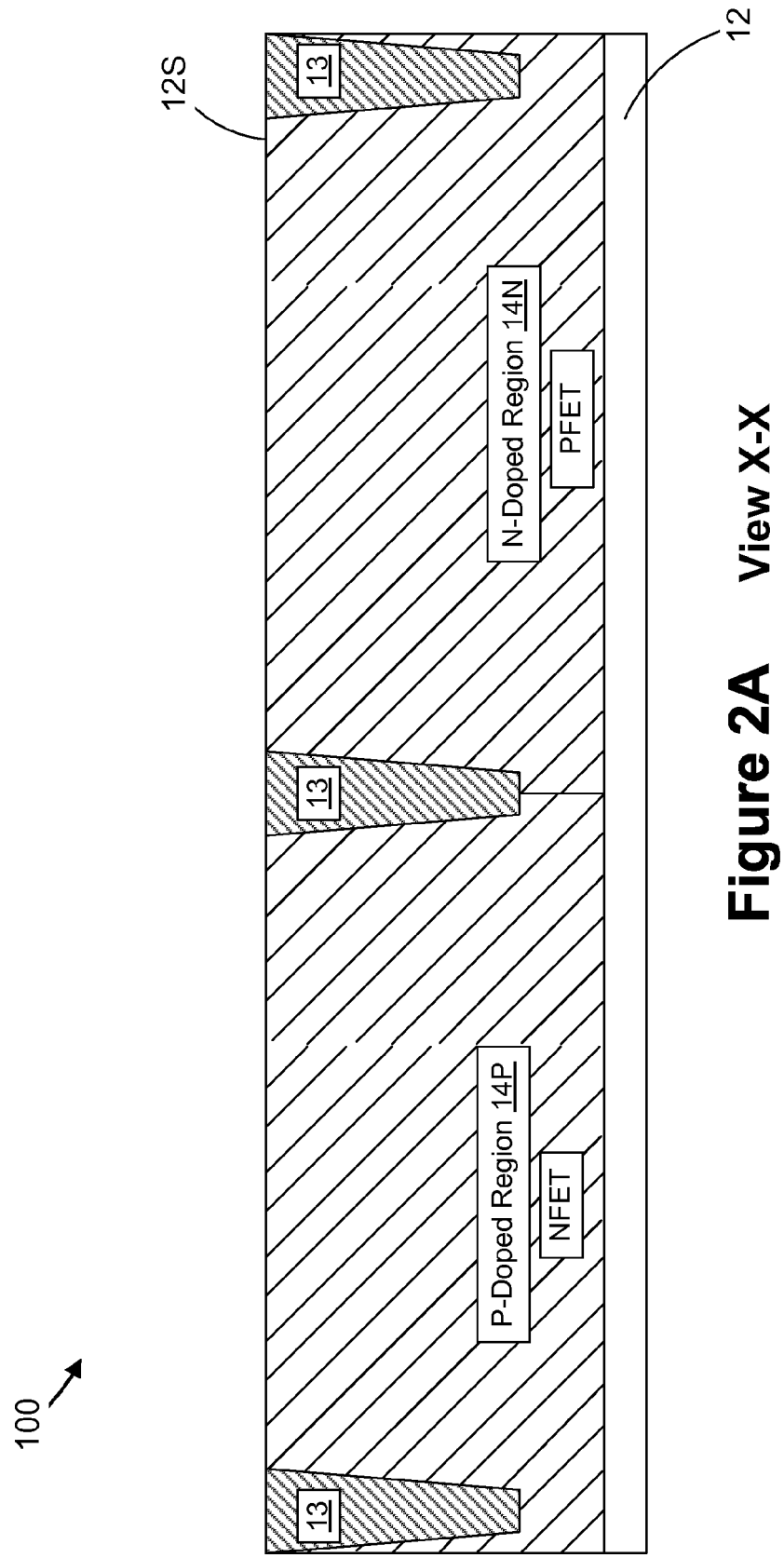
Figure 2A View X-X

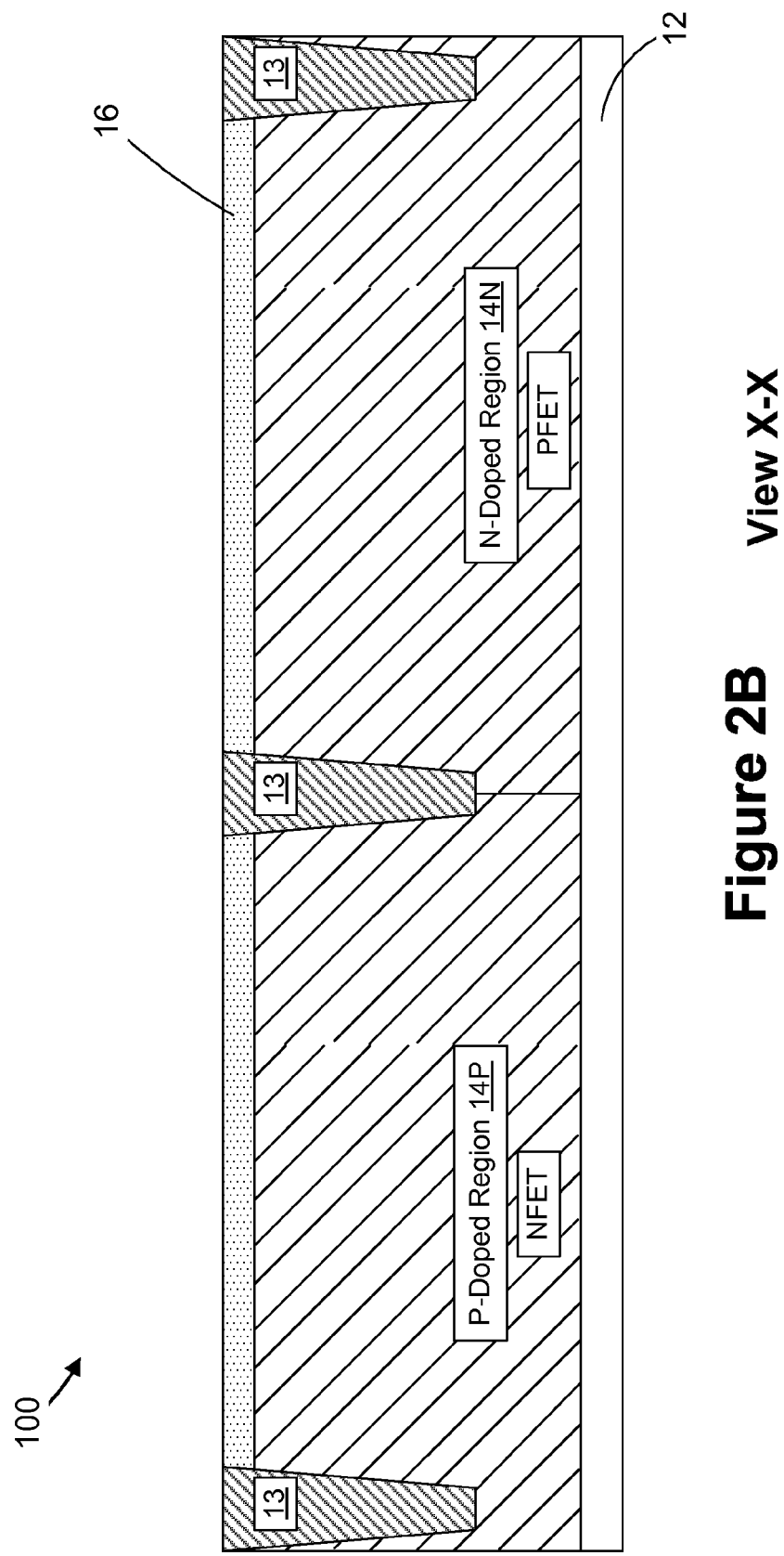
Figure 2B   View X-X

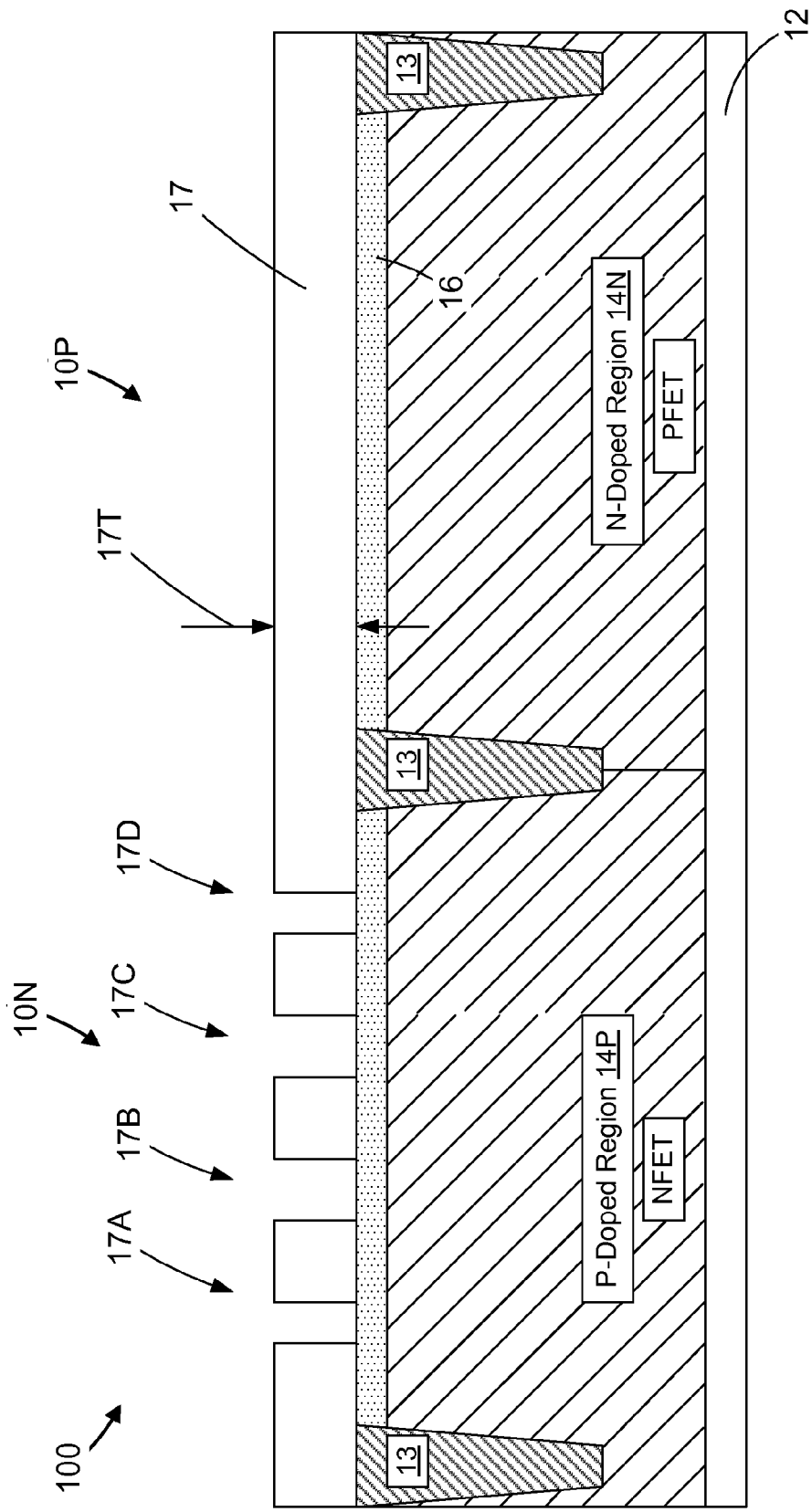
Figure 2C  View X-X

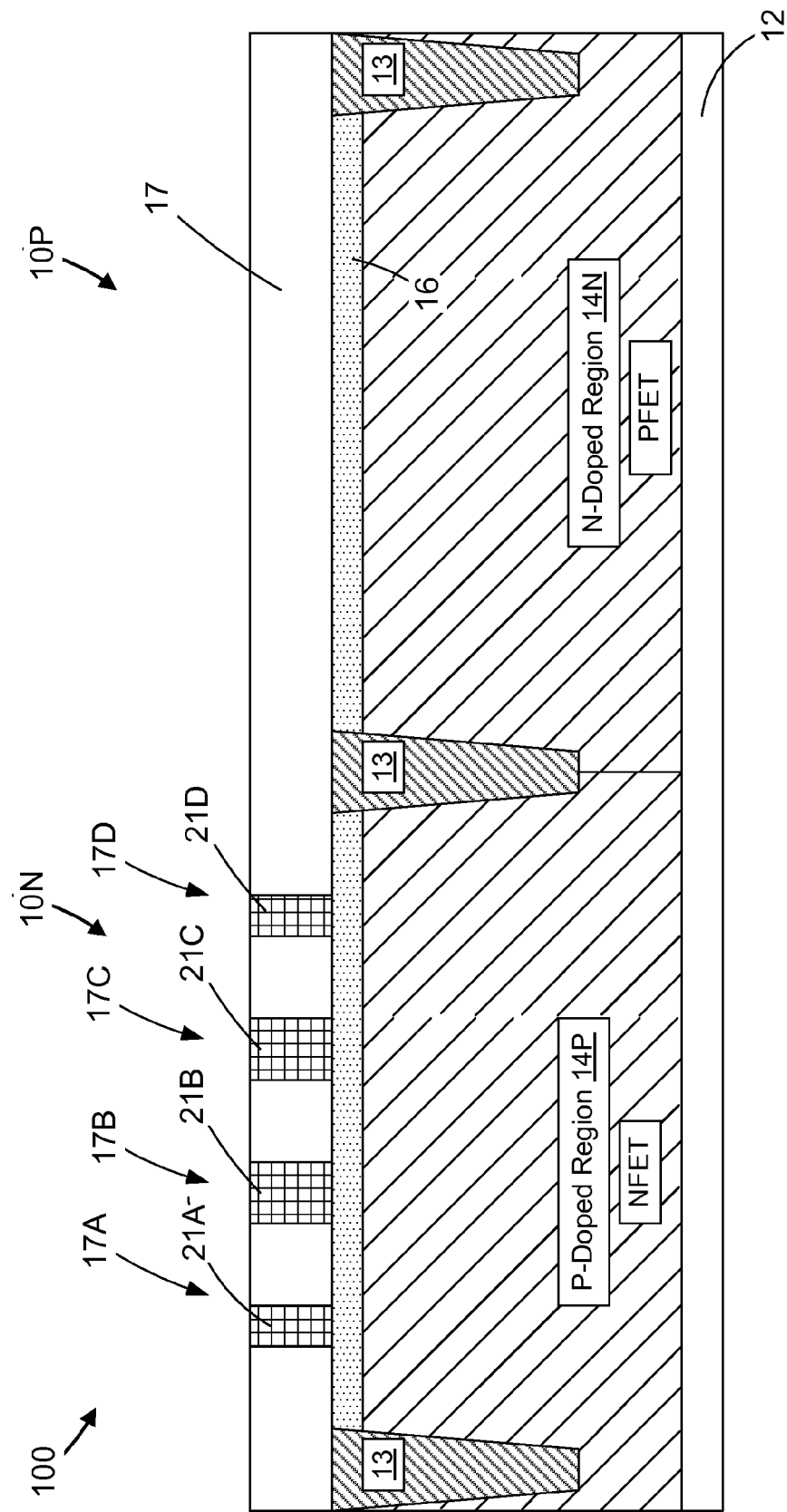
Figure 2D  View X-X

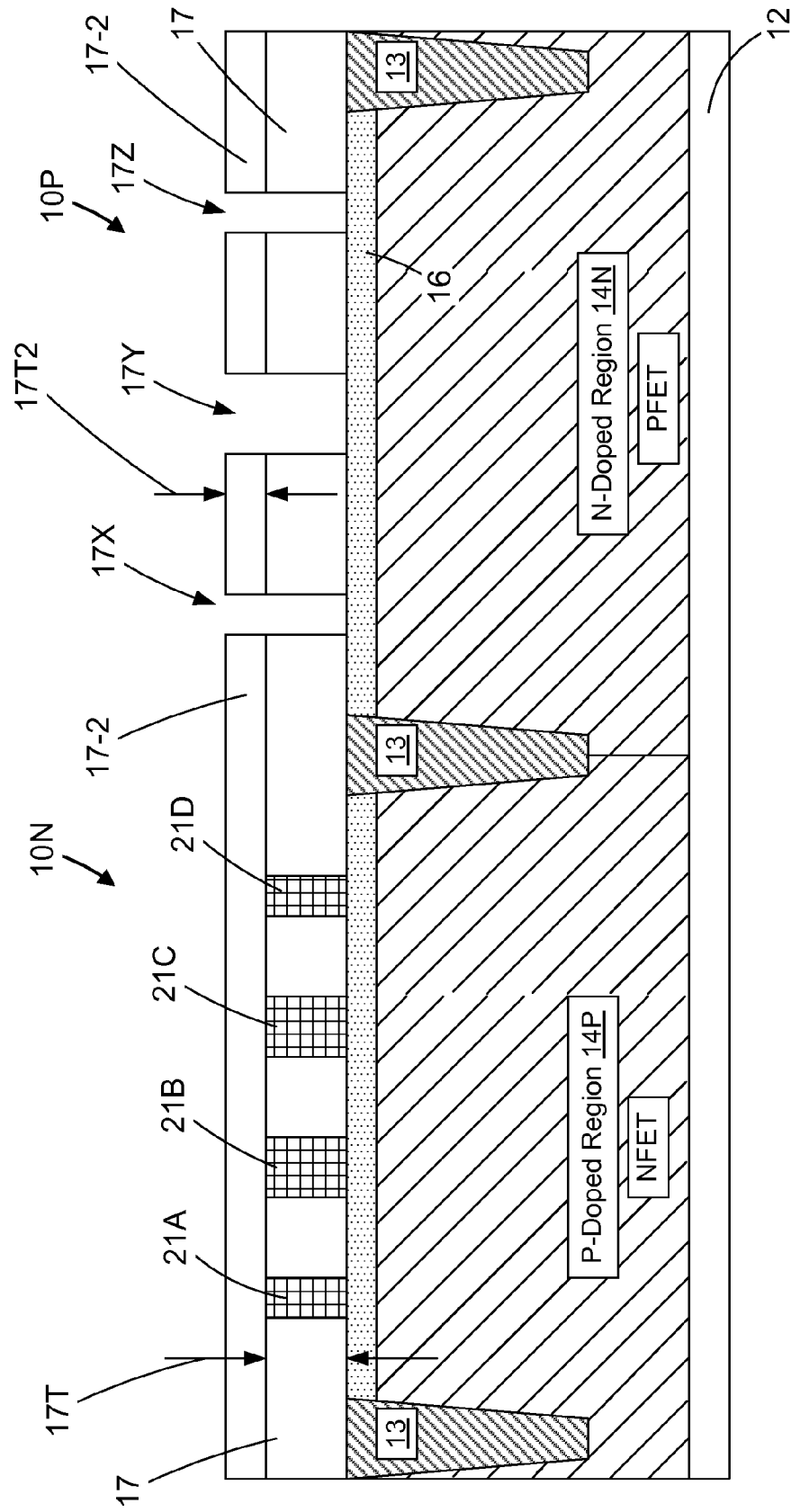
Figure 2E    View X-X

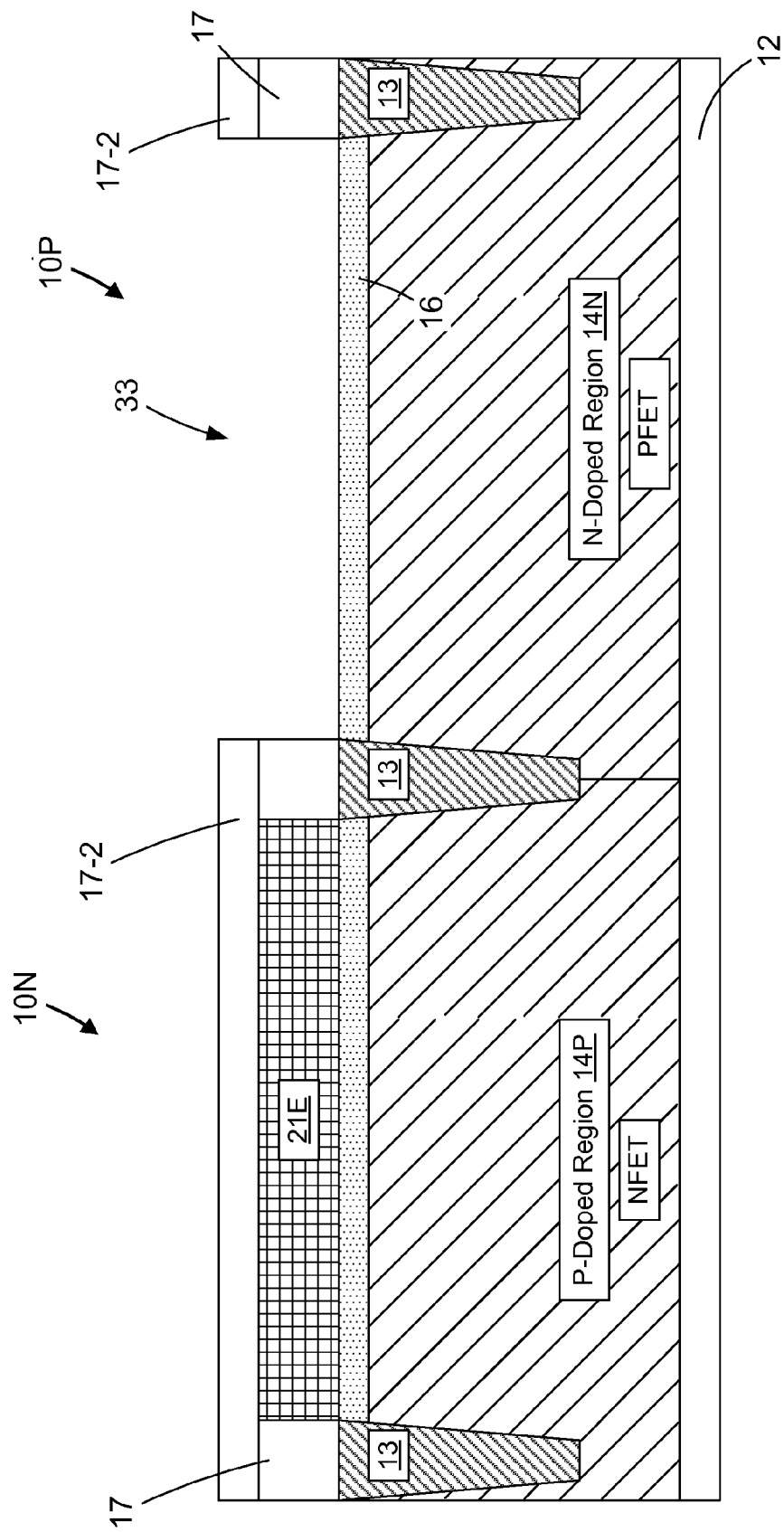
Figure 2F    View Y-Y

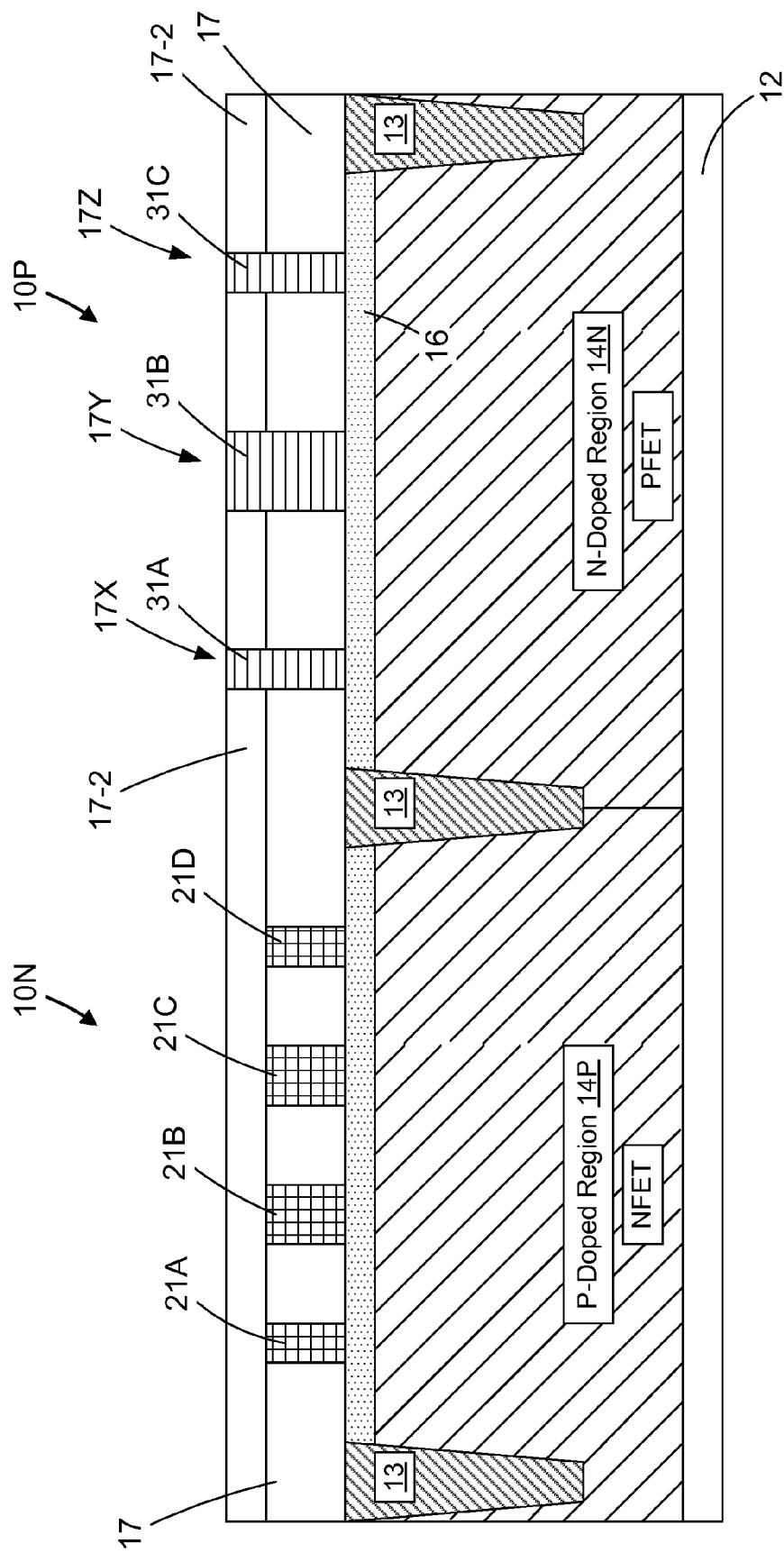
Figure 2G    View X-X

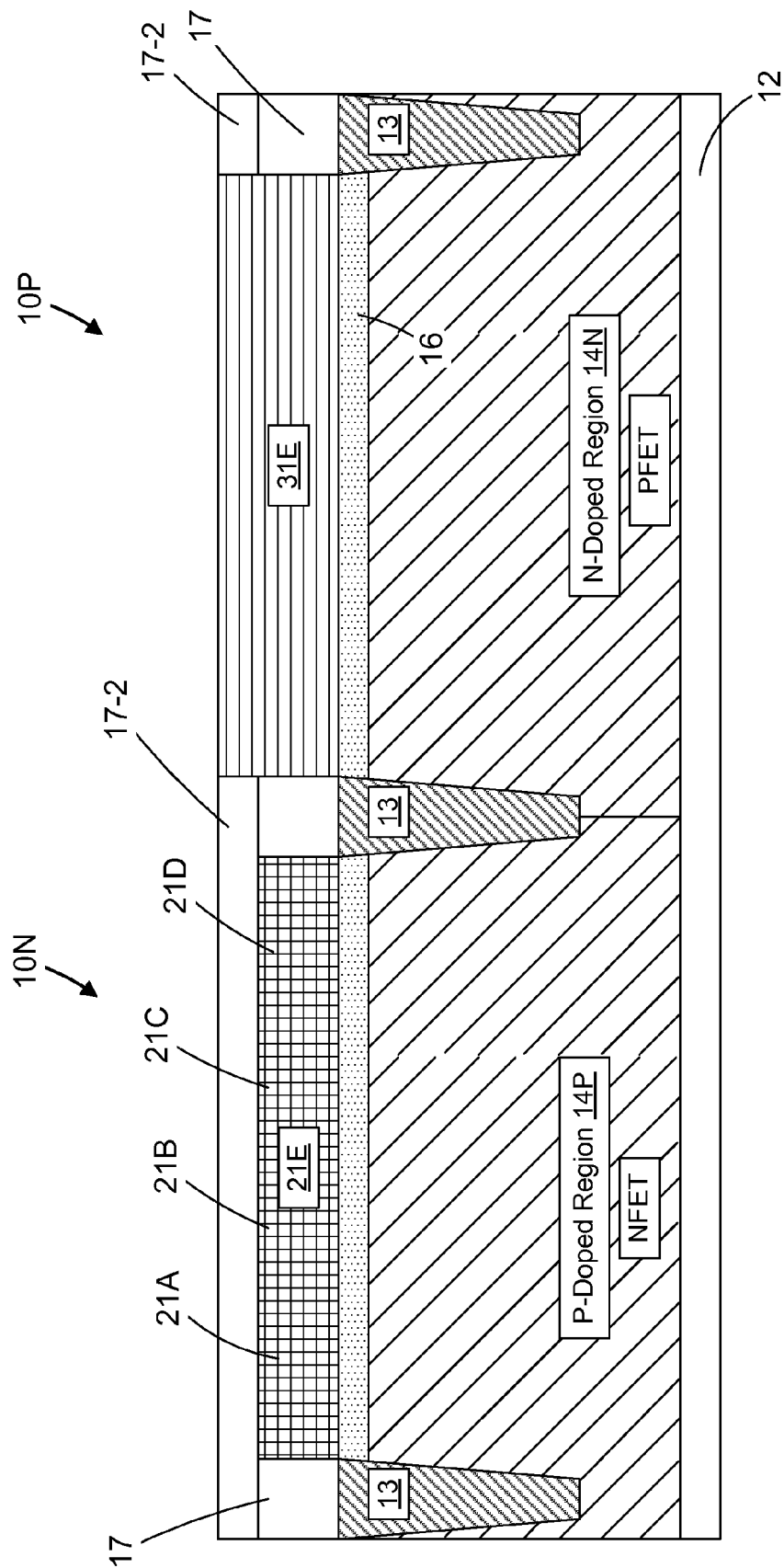
Figure 2H   View Y-Y

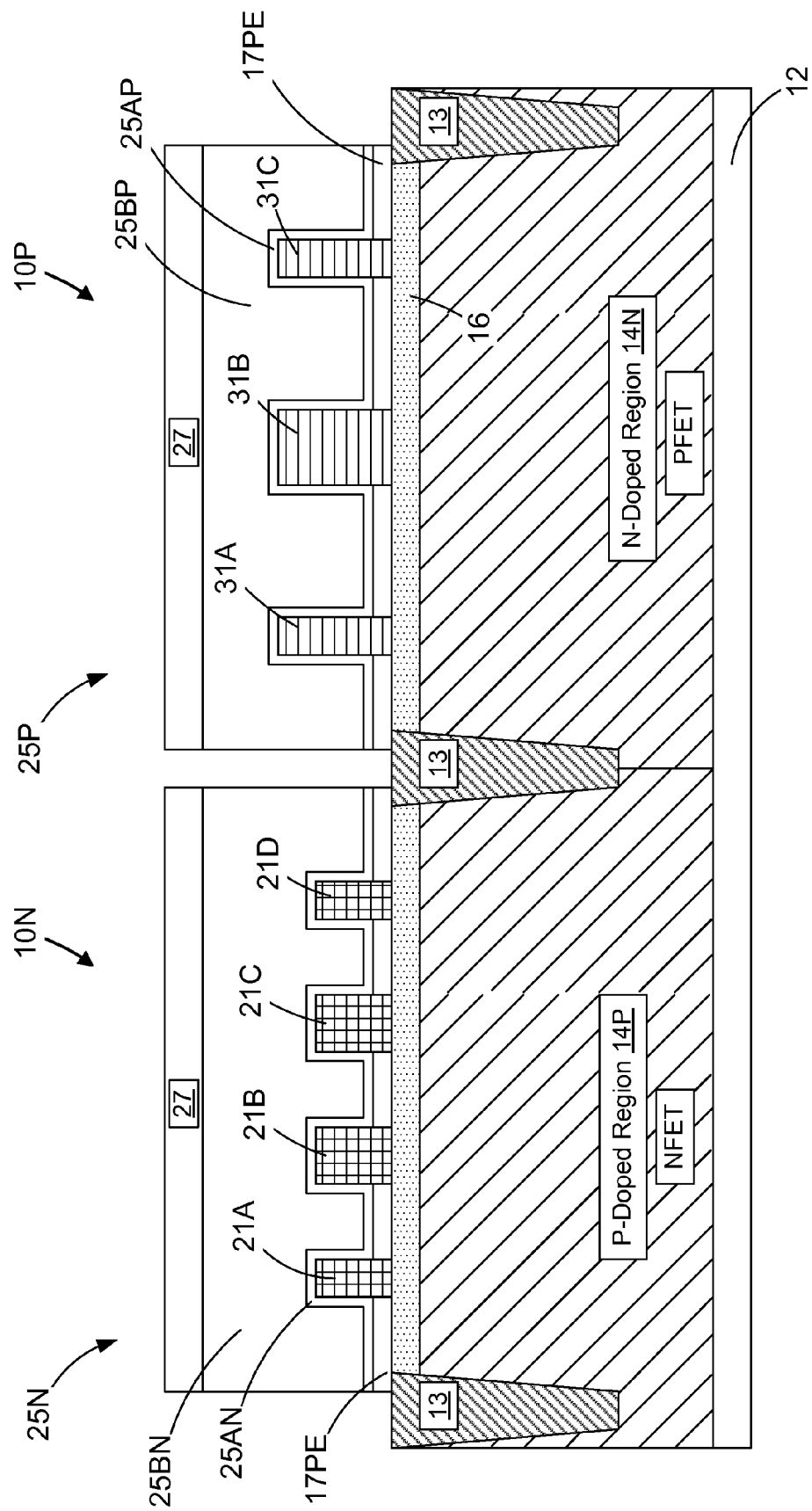
Figure 2I   View X-X

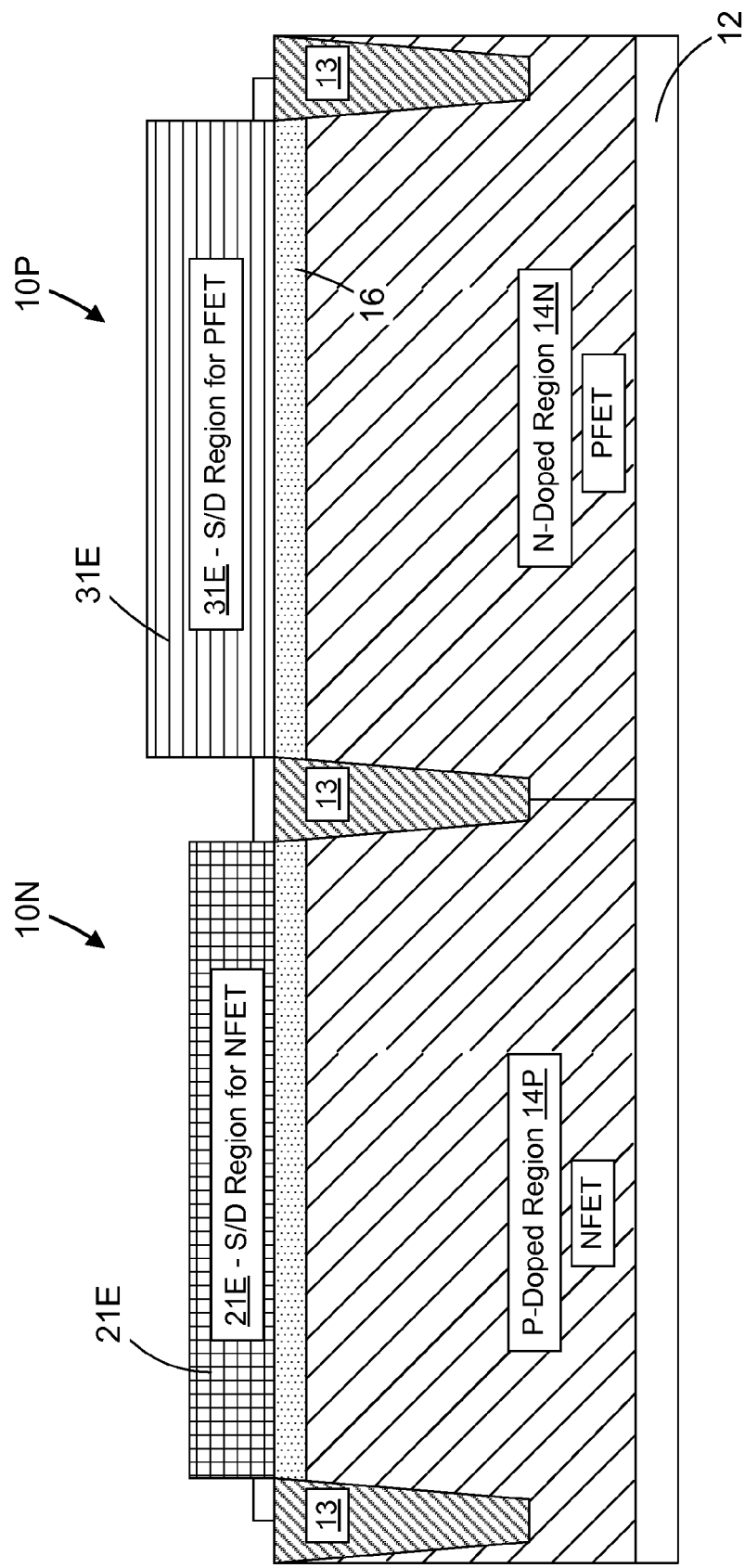
Figure 2J  View Y-Y

METHODS OF FORMING A FINFET SEMICONDUCTOR DEVICE BY PERFORMING AN EPITAXIAL GROWTH PROCESS

BACKGROUND OF THE INVENTION

1. Field of the Invention

Generally, the present disclosure relates to the manufacture of sophisticated semiconductor devices, and, more specifically, to various methods of forming a FinFET semiconductor device by performing an epitaxial growth process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region. The above description is applicable for both the N-type FET as well as the P-type FET, except that the polarity of voltage in operation and the doping type of the source, the channel and the drain regions are correspondingly reversed. In so-called CMOS (Complementary Metal Oxide Semiconductor) technology, both N-type and P-type MOSFETs (which are referred to as being "complementary" to each other) are used in integrated circuit products. CMOS technology is the dominant technology as it relates to the manufacture of almost all current-day large scale logic and memory circuits.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain, which is commonly referred to as a "punch-through" of the electrical potential from the drain to the source and leads to larger leakage currents. This is sometimes referred to as a so-called short channel effect, wherein the characteristic of the FET as an active switch is degraded.

In contrast to a planar FET, which has a planar structure, there are so-called three-dimensional (3D) devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a "tri-gate" structure so as to use a channel having a 3D "fin" structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width in the "fin" channel (as a result of the better electrostatic characteristics of the tri-gate or dual-gate structure around the fin channel) and thereby reduce so-called short channel effects. Also, in a FinFET, the junction capacitance at the drain region of the device is greatly reduced, which tends to reduce at least some short channel effects.

In one embodiment, FinFET devices have been formed on so-called silicon-on-insulator (SOI) substrates. An SOI substrate includes a bulk silicon layer, an active layer and a buried insulation layer made of silicon dioxide (a so-called "BOX" layer) positioned between the bulk silicon layer and the active layer. Semiconductor devices are formed in and above the active layer of an SOI substrate. The fins are formed in the active layer and the buried insulation layer provides good isolation between the source and drain in FinFET adjacent fins. The processes used to form FinFET devices on SOI substrates have relatively good compatibility with various processes that are performed when forming planar transistor devices in CMOS applications. For example, in both applications, the gate stack and the gate insulation layer can be made of the same materials (as in planar CMOS on SOI), e.g., poly-SiON or high-k/metal-gate (HKMG), and both applications may involve performing various epitaxial silicon growth processes (e.g., SiGe for PMOS and raised SD for NMOS), as well as the formation of epi-silicon material on the fins so as to define the source/drain regions from the FinFET devices that provide good resistance and desirable stress characteristics. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same footprint as that of a planar transistor device. Accordingly, for a given plot space (or footprint), FinFETs tend to be able to generate significantly stronger drive current than planar transistor devices. Additionally, the leakage current of FinFET devices after the device is turned "OFF" is significantly reduced as compared to the leakage current of planar transistor MOSFETs due to the superior gate electrostatic control of the "fin" channel on FinFET devices. In short, the 3D structure of a FinFET device is a superior MOSFET structure as compared to that of a planar MOSFET, especially in the 20 nm CMOS technology node and beyond.

Recently, device manufacturers have become more interested in forming FinFET devices on bulk silicon substrates in an effort to reduce costs and to make the FinFET formation processes more compatible with planar CMOS process flows on bulk substrates. However, use of a bulk substrate typically requires the formation of shallow trench isolation (STI) regions in the substrate to electrically isolate the devices. The fins of a FinFET device only need to have a relatively shallow or small fin height, e.g., about 20-40 nm. In contrast, the STI regions that are formed to electrically isolate adjacent FinFET devices are typically required to be much deeper (or taller), e.g., about 100-300 nm, than the height of the fins. Typically, a plurality of trenches are formed in the substrate to define the areas where STI regions will be formed and to define the initial structure of the fins, and these trenches are typically formed in the substrate during the same process operation for processing simplicity. The trenches are desirably designed with the same pitch (for better resolution for lithography) and they are formed to the same depth and width (for processing simplicity), wherein the depth of the trenches is sufficient for the needed fin height and deep enough to allow formation of an effective STI region. After the trenches are formed, a layer of insulating material, such as silicon dioxide, is formed so as to overfill the trenches. A chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

The above-described process flow resulted in the fin height for all FinFET devices, both P-type and N-type, being substantially the same. Additionally, the above-described process flow necessitated the formation of relatively deep trenches and created problems in filling such deep, high aspect ratio trenches. Moreover, the channel width of the P-type and N-type FinFET devices could not be selectively adjusted without adding additional masking and etching steps, etc., thereby depriving device designers of an economical means of forming N-type and P-type FinFET devices with channel widths which are adjustable by virtue of the process.

The present disclosure is directed to various methods of forming a FinFET semiconductor device by performing an epitaxial growth process that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a FinFET semiconductor device by performing an epitaxial growth process. One illustrative method of forming a FinFET device involves performing an epitaxial growth process to form a layer of semiconducting material on a semiconducting substrate, wherein a first portion of the layer of semiconducting material will become a fin structure for the FinFET device and wherein a plurality of second portions of the layer of semiconducting material will become source/drain structures of the FinFET device, forming a gate insulation layer around at least a portion of the fin structure and forming a gate electrode above the gate insulation layer.

Another illustrative method involves forming a masking layer above a semiconducting substrate, wherein the masking layer exposes a first exposed region of the substrate where at least one fin structure for the device will be formed and a plurality of second exposed regions where a plurality of source/drain structures for the device will be formed, with the masking layer in position, performing an epitaxial growth process to form a layer of semiconducting material on the first and second exposed regions of the substrate to thereby form the fin structure and the plurality of source/drain structures, performing a process operation to reduce an initial thickness of the masking layer (so that the fin is revealed with the fin height equal to the thickness reduction of the masking layer) and forming a gate insulation layer around at least a portion of the fin structure and forming a gate electrode above the gate insulation layer.

Yet another illustrative method involves forming a FinFET device comprised of at least first and second fin structures and a plurality of source/drain structures, wherein the first fin structure has a width that is different than a width of the second fin structure. In this example, the method involves forming a masking layer above a semiconducting substrate, wherein the masking layer exposes a first exposed region of the substrate where the first fin structure will be formed, a second region of the substrate where the second fin structure will be formed and a plurality of third exposed regions of the substrate where the plurality of source/drain structures will be formed, the first and second exposed regions having different widths, with the masking layer in position, performing an epitaxial growth process to form a layer of semiconducting material on the first, second and third exposed regions of the substrate, performing at least one process operation to remove the second masking layer and to reduce an initial thickness of the first masking layer (so that the fins are revealed), forming a first gate insulation layer around at least a portion of the first fin structure, forming a second gate insulation layer around at least a portion of the second fin structure, forming a first gate electrode above the first gate insulation layer and forming a second gate electrode above the second gate insulation layer.

Another method disclosed herein is directed to forming first and second FinFET devices above first and second portions of a semiconducting substrate, respectively, wherein the first FinFET device has at least one first fin structure and a plurality of first source/drain structures, the second FinFET device has at least one second fin structure and a plurality of second source/drain structures, and wherein the first fin structure is shorter (or has a lower fin height) than the second fin structure. In this example, the method involves forming a first masking layer above the first and second portions of the substrate, wherein the first masking layer covers the second portion of the substrate while it exposes a first exposed region of the first portion of the substrate where the first fin structure will be formed, with the first masking layer in position, performing a first epitaxial growth process to form a first layer of semiconducting material on the first portion of the substrate, wherein a first portion of the first layer of semiconducting material is the first fin structure for the first FinFET device and a plurality of second portions of the first layer of semiconducting material are the plurality of first source/drain structures of the first FinFET device, forming a second masking layer above the first masking layer and above the first and second portions of the substrate, forming at least one opening through the first and second masking layers positioned above the second portion of the substrate so as to expose a first exposed region of the second portion of the substrate where the second fin structure will be formed, with the first and second masking layers in position, performing a second epitaxial growth process to form a second layer of semiconducting material on the second portion of the semiconducting substrate, wherein a first portion of the second layer of semiconducting material is the second fin structure for the second FinFET device and wherein a plurality of second portions of the second layer of semiconducting material are the second source/drain structures of the second FinFET device, performing at least one process operation to remove the second masking layer and to reduce an initial thickness of the first masking layer (so that the fins are revealed), forming a first gate insulation layer around at least a portion of the first fin structure, forming a second gate insulation layer around at least a portion of the second fin structure, forming a first gate electrode above the first gate insulation layer and forming a second gate electrode above the second gate insulation layer.

One example of a novel FinFET device disclosed herein includes a layer of a semiconducting material positioned above an active region of a semiconducting substrate, wherein a first portion of the layer of semiconducting material constitutes at least one fin structure for the FinFET device and wherein a plurality of second portions of the layer of semiconducting material constitutes source/drain structures of the FinFET device. In this example, the source/drain structures have a width that is the same as the width dimension of the active region in a direction that is parallel to the gate width of the FinFET device. The device further includes a gate insulation layer positioned around at least a portion of the fin structure and a gate electrode positioned above the gate insulation layer.

BRIEF DESCRIPTION OF THE DRAWINGS

The disclosure may be understood by reference to the following description taken in conjunction with the accompanying drawings, in which like reference numerals identify like elements, and in which:

FIGS. 2A-2J depict various illustrative methods of forming FinFET devices wherein the devices have different fin heights.

Figure 1A:
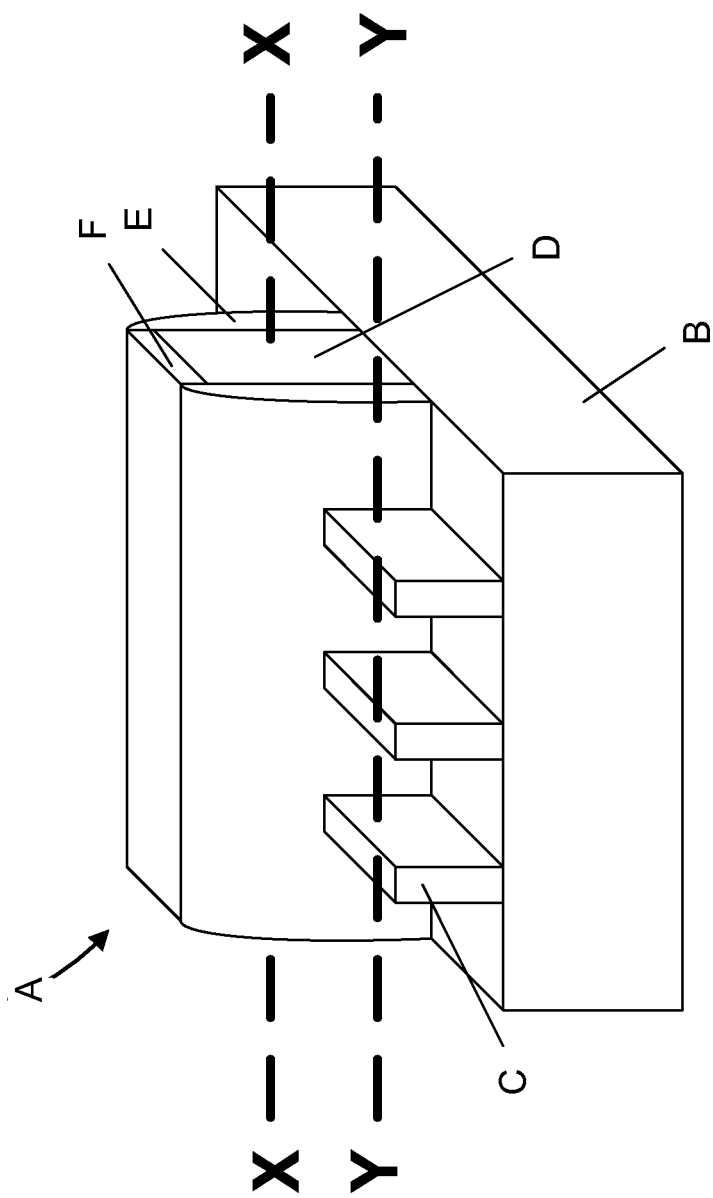
FIGS. 1A-1T depict various illustrative methods of forming various illustrative embodiments of the novel FinFET devices disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a FinFET semiconductor device by performing a selective epitaxial growth (SEG) process. As will be readily apparent to those skilled in the art upon a complete reading of the present application, the methods disclosed herein may be employed in manufacturing a variety of different integrated circuit products, including, but not limited to, logic devices, memory devices, etc., and they may be employed with respect to a variety of different technologies, e.g., N-type devices, P-type devices, CMOS applications, etc. With reference to the attached figures, various illustrative embodiments of the methods and devices disclosed herein will now be described in more detail.

FIG. 1A is a perspective view of an illustrative FinFET semiconductor device A that is formed above a semiconducting substrate B. The device A includes a plurality of fins C, a gate electrode D, sidewall spacers E and a gate cap layer F. FIG. 1A depicts the locations where various cross-sectional views of the devices disclosed herein will be taken in the drawings discussed below. More specifically, view "X-X" is a cross-sectional view taken through the gate electrode D in a direction that is parallel to the long axis of the gate electrode D, i.e., in the gate width direction. The portions of the fins C covered by the spacer E and the gate electrode D are the channel regions of the FinFET device. The view "Y-Y" is a cross-sectional view taken through the fins C in a direction that is transverse to the long axis of the fins C (outside the gate electrode D and the spacer E), i.e., through what will become the source/drain regions of the device. In a conventional process flow, the portions of the fins C that are positioned in the source/drain regions are increased in size or even merged together (not shown here) by performing one or more epi growth processes. The process of increasing the size of or merging the fins C in the source/drain regions of the device is to reduce the resistance of source/drain regions or to induce tensile or compressive stress in the channel area. It should be understood that FIG. 1A is only provided to show the location of the various cross-sectional views depicted in the drawings below, and many aspects discussed below are not depicted in FIG. 1A so as to not overly complicate the device A depicted in FIG. 1A.

FIGS. 1B-1T depict various illustrative embodiments of a FinFET semiconductor device 10 disclosed herein, and various methods of making the FinFET device 10. The device 10 may be either an N-type device or a P-type device, and it may be formed using either so-called "gate-first" or "replacement gate" ("gate-last") techniques.

FIG. 1B depicts the device 10 at a point of fabrication wherein an illustrative isolation structure 13, e.g., a shallow trench isolation (STI) structure, has been formed in a semiconducting substrate 12 using traditional manufacturing techniques. At this point in the process flow, the upper surface 12S of the substrate 12 has been cleared of any other material layers and is thus exposed for further processing. The illustrative substrate 12 may be a bulk semiconducting substrate, or it may be the silicon active layer of a so-called SOI substrate. Thus, the terms "substrate" or "semiconducting substrate" should be understood to cover all semiconducting materials and all forms of such semiconducting materials. As noted above, the device 10 may be either an N-type or P-type device. Thus, the substrate 12 may have various doped wells (not shown in FIGS. 1B-1T) formed therein as is customary in the fabrication of integrated circuit devices. As will be recognized by those skilled in the art after a complete reading of the present application, an illustrative N-type FinFET device would be formed above a P-doped region (also referred to as a P-well), while an illustrative P-type FinFET device would be formed above an N-doped region (also referred to as an N-well). The amount of doping, the dopant species used and the depth of the doped regions may vary depending upon the particular application.

As will be described more fully below, in one illustrative embodiment, the device 10 may be formed with super-steep channel profiles. In general, such super-steep channel profiles may be formed by forming non-doped epitaxially grown layers of a semiconductor material and then performing ion implantation processes with, for example, carbon to form doped regions (underneath the non-doped epi grown layer) in a semiconducting material, such as the substrate 12. Alternatively, an implant process may be performed on the surface of a bulk substrate or an SOI substrate, then the epi-grown non-doped layer may be formed on top to form a super-steep dopant profile. The non-doped or low-doped portion will be used for channel regions of the FinFET device 10. Both techniques are known to those skilled in field. As described above, the super-steep channel profiles may be formed by performing only epitaxial growth/deposition processes, by performing only ion implantation processes or by performing any combination of epitaxial growth/deposition processes and ion implantation processes in any desired order. Thus, when it is stated in this specification and/or in the claims that a "carbon doped layer" is formed relative to another structure or layer, it should be understood that such a "carbon doped layer" may be formed by an epitaxial growth/deposition process (with in situ carbon doping) or it may be a carbon implanted region formed in a semiconducting substrate, such as the illustrative substrate 12. Accordingly, the present inventions should not be considered to be limited to the manner in which the doped layers that are part of the super-steep profile are formed.

As shown in FIG. 1C, in one illustrative embodiment, a carbon doped buffer layer 16 is formed in or on the substrate 12, depending upon the manner in which it is made, e.g., by performing an epitaxial deposition process or by performing an ion implantation process to form the carbon doped buffer layer 16. In the example depicted in FIG. 1C, an ion implantation process was performed to implant carbon into the substrate 12 so as to thereby form the carbon doped buffer layer 16 in the substrate 12. The carbon doped layer 16 tends to suppress the upward diffusion of dopant materials in the substrate 12 below the carbon doped layer 16. Nitrogen and fluorine may also be implanted in any combination when forming the carbon doped buffer layer 16. The concentration of carbon in the carbon doped buffer layer 16 as well as the depth or thickness of the carbon doped buffer layer 16 may vary depending upon the particular application. In one illustrative example, the doped buffer layer 16 may have a thickness of about 5 nm and it may have a carbon concentration of about $10^{17}$-$10^{19}$ atoms/cm$^3$. Depending upon the particular application, the ion implantation process that is performed to form the carbon doped buffer layer 16 may be performed using a dopant dose of about $1E^{14}$-$1E^{16}$ ion/cm$^2$ and at an energy level that falls within the range of about 1-10 keV. The thin carbon doped buffer layer 16 serves as a transition layer between the doped well (not shown) in the substrate 12 and the material to be subsequently formed above the substrate 12. In general, the carbon doped buffer layer 16 may tend to help reduce the number of defects and suppress the upward dopant diffusion from substrate 12 below, therefore, increasing the likelihood of subsequently forming substantially defect-free non-doped (or low-doped) layers of material above the substrate 12.

FIGS. 1D and 1E (cross-sectional views) and 1F (a plan view) depict the device 10 after a masking layer 17, with a thickness 17T, is formed above the carbon doped layer 16 in the substrate 12. The masking layer 17 may be comprised of any of a variety of different materials. The masking layer 17 is intended to be representative in nature as it may be comprised of a variety of materials, such as, for example, silicon nitride, silicon oxynitride, $Al_2O_3$, $HfO_2$, etc. Moreover, the masking layer 17 may be comprised of multiple layers of material, such as, for example, a silicon nitride layer and a layer of silicon dioxide. The masking layer 17 may be formed by depositing the layer(s) of material that comprise the masking layer 17 and thereafter directly patterning the masking layer 17 using known photo-lithography and etching techniques. Alternatively, the masking layer 17 may be formed by using known sidewall image transfer techniques. Thus, the particular form and composition of the masking layer 17 and the manner in which it is made should not be considered a limitation of the present invention. In the case where the masking layer 17 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

In the example depicted in FIGS. 1D-1F, the illustrative FinFET device 10 will be comprised of four illustrative fins. However, as will be recognized by those skilled in the art after a complete reading of the present application, the presently disclosed inventions may be employed in manufacturing FinFET devices with a single fin or any desired number of fins. Moreover, in the case where the FinFET device under construction is comprised of multiple fins, the width of the fins may be individually varied or they may all have the same width. In the depicted example, the masking layer 17 defines regions or trenches 17A-D where the fins or the channel portions of the FinFET device 10 will be formed and regions or trenches 19 where the source/drain regions for the FinFET device 10 will be formed. In the methods disclosed herein, the fins or channel portions and the source/drain regions of the FinFET device 10 will all be formed in a common epitaxial deposition process.

With continuing reference to FIGS. 1D-1F, in the depicted example, all of the trenches 17A-D have the same axial length 17L (see FIG. 1F). In this particular example, the trenches 17A, 17D have the same width 17W1, while the trenches 17B, 17C have the same width 17W2, wherein the width 17W2 is greater than the width 17W1. As noted above, the width of the trenches 17A-D will correspond to the width of the fins or channel portions of the device 10, and the width of the fins may vary depending upon the device under construction. In current-day technology, the trenches 17A-D may be formed so as to have a width that falls within the range of about 10-30 nm. The height of the fins of the FinFET device 10 will be approximately determined by the thickness 17T of the masking layer 17. In one illustrative embodiment, using current-day technology, the thickness 17T may have a thickness that falls within the range of about 20-80 nm. In the example depicted in FIGS. 1E-1F, the region or trenches 19 (for the source/drain regions) are connected to the trenches 17A-D and the trenches 19 have a width 19W1. This corresponds approximately to a "merged" fin configuration. However, in some applications, it may be desired to have the fin portions that will become the source/drain regions not be merged together. This latter non-merged configuration may be useful depending upon the particular application, e.g., where it is desired to use stress engineering techniques on the source/drain structures in order to induce higher stress levels in the channel region for mobility enhancement. For simplicity, the case where "merged" source/drain regions of fins are formed will be depicted in most of the attached drawings and discussed below.

As noted above, using the methods disclosed herein, FinFET devices 10 may be formed wherein the width of the fins, which corresponds to the width of the trenches formed in the masking layer 17, may be individually varied if desired. For example, FIG. 1G depicts an illustrative example of a FinFET device 10 that will be comprised of four fins, each of which has a different width. More specifically, as shown in FIG. 1G, the masking layer 17 is formed with trenches 17E-H wherein each of the trenches is successively wider. FIG. 1H depicts an illustrative FinFET device 10 that will be comprised of two fins that each have different widths. Accordingly, the width of the trench 17I in the masking layer 17 in FIG. 1H is less than the width of the trench 17J. Lastly, FIG. 1I depicts an illustrative FinFET device 10 that will be comprised of two fins that each have the same width. Thus, the width of the trench 17K in the masking layer 17 in FIG. 1I is the same as the width of the trench 17L. As it should be clear from the foregoing, the methods disclosed herein provide device designers with great flexibility in manufacturing FinFET devices that are tailored for specific applications.

FIGS. 1J, 1K and 1L (a plan view) depict the FinFET device 10 after a substantially un-doped or low-doped layer of semiconducting material layer 21, e.g., un-doped epi silicon, SiGe, Ge, a so-called III-V material (e.g., GaAs, InP), and so-called II-VI compounds, etc., has been formed above the portions or regions of the substrate 12 exposed by the masking layer 17. That is, using the method disclosed herein, the fin structures 21A-D and the source/drain structures 21E of the FinFET device 10 are formed in a common selective epitaxial deposition process that is performed to form the semiconducting material layer 21. Of course, additional processing operations may need to be performed on the fin structures 21A-D and/or the source/drain structures 21E to make them final fins and/or source/drain regions for the device 10. For example, dopant materials may be added to the fin structures 21A-D and/or the source/drain structures 21E by way of performing various ion implantation processes. Using the methods disclosed herein, the fin structures 21A-D and/or the source/drain structures 21E are made from a single layer of semiconducting material 21 wherein the fin structures 21A-D are positioned between and separate the spaced-apart source/drain structures 21E. Also note that the source/drain structures 21E are full width structures that have a width 21W (in a direction parallel to the gate width of the device 10) that is the same as the width of the active region of the substrate 12 defined by the isolation region 13. Accordingly, using the methods disclosed herein, prior art processing steps like so-called fin merger epi-grown processes performed on traditional fin structures positioned outside of the gate are not required.

By "substantially un-doped" it is meant that no dopant materials are intentionally included in manufacturing the substantially un-doped layer of semiconducting material 21. Thus, the substantially un-doped layer of semiconducting material 21 may have a dopant concentration of less than about $10^{15}$ atoms/cm$^3$. As a result, the FinFET device 10 that will be formed using portions of the substantially un-doped layer of semiconducting material 21 will be fully depleted during device operation. The thickness of the substantially un-doped layer of semiconducting material 21 will generally correspond to the thickness 17T of the masking layer 17, although there may be a small amount of overfilling of the trenches 17A-D and 19 during the epitaxial deposition process, as reflected in FIGS. 1J, 1K. The substantially un-doped layer of semiconducting material 21 may be formed by performing well-known epitaxial growth processes.

However, as noted above, in some applications, it may desired to have the source/drain structures that will become the source/drain regions for the device 10 not be merged together. For example, FIGS. 1S-1T depict an illustrative example of such a non-merged configuration. As shown in FIG. 1S, the masking layer 17 has been patterned in such a way that "dedicated" trenches 19A are connected to the trench 17A. The other trenches 17B-D are connected to corresponding discreet and separate trenches 19B-D, respectively. Note that, in this example, the trenches 19A-D are wider than their corresponding trenches 17A-D. That is, the trenches 19A have a width 35 that is greater than the width 17W1 of the trench 17A. Similarly, the trenches 19C have a width 37 that is greater than the width 17W2 of the trench 17C. FIG. 1T depicts the device 10 after the substantially un-doped material layer 21 has been formed by performing an SEG process. This results in the formation of the plurality of fin structures 17A-D as well as the formation of the separated source/drain structures 21EA-ED, where the source/drain structures 21EA-ED are wider than the corresponding fin structures 17A-D. Again, as noted above, the drawings below make reference to the "merged" source/drain configuration so as to simplify the disclosure.

If desired, as shown in FIGS. 1M-1N, an optional "touch-up" chemical mechanical planarization (CMP) process may be performed to planarize the upper surface of the layer of semiconductor material 21 with the upper surface of the masking layer 17.

FIGS. 1O and 1P (plan view) depict the FinFET device 10 after several process operations have been performed. First, an etch-back process was performed on the masking layer 17 to define a post-etch layer 17PE. This etch-back process reveals portions of the fin structures 21A-D and the source/drain structures 21E. The post-etch layer 17PE may have a thickness that falls within the range of about 5-10 nm. The post-etch layer 17PE serves as an isolation material between a gate electrode to be formed on the device 10 and the substrate 12. Thereafter, an illustrative gate structure 25 (comprised of an illustrative gate insulation layer 25A and an illustrative gate electrode 25B) and a gate cap layer 27 has been formed for the FinFET device 10. As will be recognized by those skilled in the art after a complete reading of the present application, the gate structure 25 depicted in the drawings, i.e., the gate insulation layer 25A and the gate electrode 25B, is intended to be representative in nature. For example, the gate insulation layer 25A may be comprised of a variety of different materials, such as, for example, silicon dioxide, silicon oxynitride, various high-k (k greater than 10) dielectric materials (where k is the relative dielectric constant), etc. The gate electrode 25B may be comprised or one or more layers of conductive material, e.g., doped polysilicon, one or more layers of metal, a metal nitride, etc. The gate structure 25 may be formed using either "gate-first" or "replacement gate" (also known as "gate-last") techniques.

The gate cap layer 27 may be comprised of a variety of different materials, e.g., silicon nitride, silicon dioxide. In one illustrative example, the materials corresponding to the gate insulation layer 25A, the gate electrode layer(s) 25B and the gate cap layer 27 may all be formed above the semiconductor material layer 21 and thereafter patterned using traditional masking and etching processes to define the basic gate structure 25 and the cap layer 27 depicted in the drawings. With reference to FIG. 1P, in one illustrative embodiment, the gate length 25L of the gate structure 25 may be less than the axial length 17L of the trenches 17A-D (see FIG. 1F), thereby exposing portions of post-etch layer 17PE. Ideally, the trench length 17L may be set to be about the same dimension as the final desired gate length 25L.

Figure 1Q:
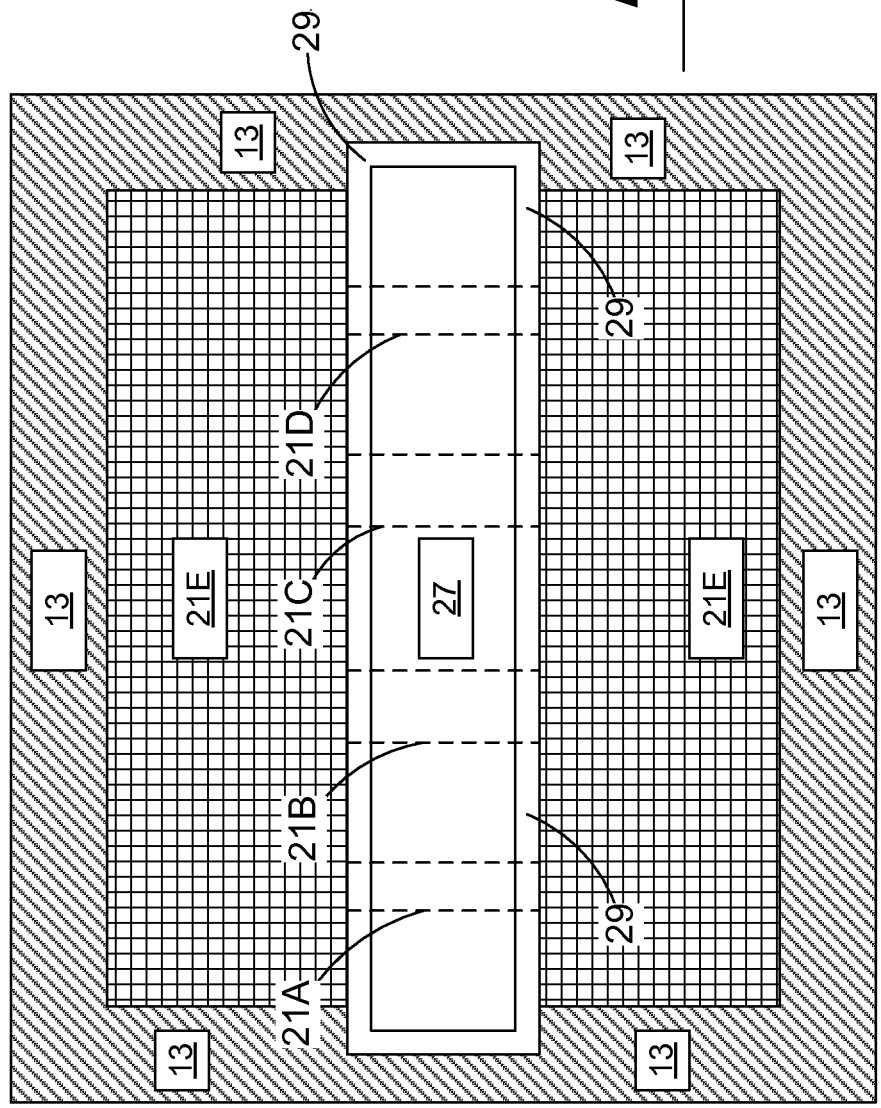
Figure 1S:
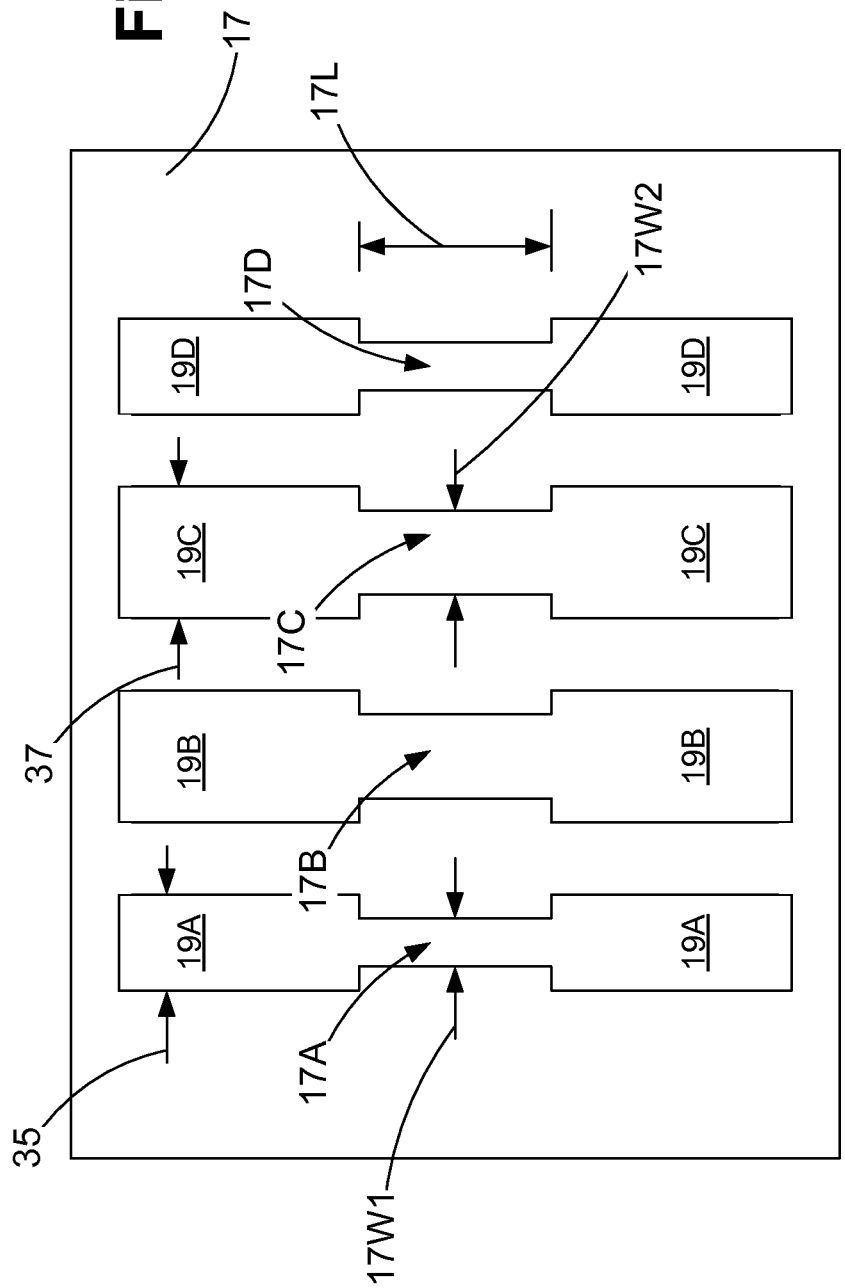

FIGS. 1Q (plan view) and 1R depict the FinFET device 10 after a sidewall spacer 29 has been formed around the gate structure 25 and the source/drain structures 21E. The spacer 29 may be comprised of a variety of different materials, e.g., silicon nitride, silicon dioxide, or a combination thereof. The spacer 29 may be formed by depositing a layer of spacer material and thereafter performing an anisotropic etching process.

Of course, as will be recognized by those skilled in the art after a complete reading of the present application, in one specific example, the methods disclosed in FIGS. 1A-1T may be employed to form different types of FinFET devices 10, i.e., an N-type FinFET as opposed to a P-type FinFET device, wherein the widths of the fins on the different types of devices may be different. For example, using the methods disclosed above, the fins of all of or some of the N-type FinFET devices that are formed on an integrated circuit product may have smaller width fins than all or some of the fins on the P-type FinFET devices on the same integrated circuit product, or vice-versa. This may be readily accomplished by forming trenches, e.g., 17A-D of the desired width for each particular type of device. Additionally, as noted above, the width of each of the fins in a single device (either N-type or P-type) comprised of multiple fins may be varied if desired.

FIGS. 2A-2J depict various illustrative methods of forming an integrated circuit product 100 comprised of, for example, different types of FinFET devices, i.e., an N-type FinFET as opposed to a P-type FinFET device, wherein the different types of FinFET devices have different fin heights and/or differing fin widths. However, it should be understood that the methods disclosed herein may also be employed to form the same type of FinFET devices with differing fin heights, e.g., multiple N-type FinFET devices wherein the fin height in each N-type FinFET device is different from the other N-FinFET devices.

FIG. 2A depicts the product 100 at the point of fabrication after illustrative isolation structures 13, e.g., shallow trench isolation (STI) structures, a P-doped well region 14P and an N-doped well region 14N have been formed in the substrate 12. The wells 14P, 14N may be formed by performing known ion implantation and masking techniques. At this point in the process flow, the upper surface 12S of the substrate 12 has been cleared of any other material layers and is thus exposed for further processing. As will be recognized by those skilled in the art after a complete reading of the present application, an illustrative N-type FinFET device will be formed above the P-doped region 14P, while an illustrative P-type FinFET device will be formed above the N-doped region 14N. The amount of doping, the dopant species used and the depth of the doped regions 14P, 14N may vary depending upon the particular application.

FIG. 2B depicts the product 100 after the previously described carbon buffer layer 16 has been formed. In general, this aspect of the inventions disclosed herein involves formation of multiple patterned hard mask layers, similar to the hard mask layer 17 described above, above the substrate 12 to ultimately achieve the goal of forming FinFET devices with differing fin heights. As noted above, in one example, different types of FinFET devices, e.g., N and P type FinFET devices, may be formed with fins having different heights. In other applications, the methods disclosed herein may be employed to form FinFET devices of the same type with different fin heights. In both cases, the fins of the various devices may also have different fin widths if dictated by the design requirements. The example depicted in FIGS. 2A-2J involves the formation of two illustrative FinFET devices 10N, 10P. However, as will be appreciated by those skilled in the art after a complete reading of the present application, the methods disclosed herein may be extrapolated and employed in forming numerous different devices or categories of devices by forming additional patterned masking layers. For example, using the methods disclosed herein, a product 100 may be formed that contains a first group of N-FinFET devices having a first fin height, a first group of P-FinFET devices having a second fin height, a second group of N-FinFET devices having a third fin height and a second group of P-FinFET devices having a fourth fin height, wherein the first, second, third and fourth fin heights are successively greater, which provides a means to effectively "tune" the devices to achieve the desired electrical output. Additionally, the fin widths in these various groups of devices may likewise be varied if necessary for the particular product under design. As with the previous embodiment, this aspect of the inventions disclosed herein provides device designers with great flexibility if designing integrated circuit products.

As shown in FIG. 2C, the illustrative product 100 will be comprised of an illustrative N-FinFET device 10N (formed above the P-well 14P) and an illustrative P-FinFET device 10P (formed above the N-well 14N). In the depicted example, the first masking layer 17, with the thickness 17T, is formed above the substrate 12. In this example, the masking layer 17 defines the previously described regions or trenches 17A-D where the fin structures 21A-D (FIG. 2D) of the N-FinFET device 10N will be formed. The masking layer 17 also comprises the previously described regions or trenches 19 where the source/drain structures 21E for the N-FinFET device 10N will be formed (see FIG. 1K). In the methods disclosed herein, the fin structures 21A-D and the source/drain structures 21E of the N-FinFET device 10N will all be formed in a first common epitaxial deposition process, whereas the fin structures and the source/drain structures of the P-FinFET device 10P will all be formed in a second common epitaxial deposition process. In this example, the N-FinFET device 10N will be formed with four illustrative fin structures, while the P-FinFET device 10P will be formed with three illustrative fin structures. Additionally, in this example, the N-FinFET device 10N will be formed with shorter (i.e., lower height) fin structures than the P-FinFET device 10P, although that situation could be reversed if warranted by the application. In the depicted example, all of the trenches 17A-D have the same axial length 17L (see FIG. 1F). In this particular example, the trenches 17A, 17D have the same width 17W1 while the trenches 17B, 17C have the same width 17W2, wherein the width 17W2 is greater than the width 17W1. The height of the fin structures 21A-D of the N-FinFET device 10N will be approximately determined by the thickness 17T of the first masking layer 17.

FIG. 2D depicts the product 100 after the substantially un-doped or low-doped layer of semiconducting material layer 21, e.g., un-doped epi silicon, has been formed above the portions or regions of the substrate 12 exposed by the first masking layer 17 and after a "touch-up" CMP process has been performed to planarize the semiconducting material layer 21 with the upper surface of the masking layer 17. These process operations result in the formation of the fin structures 21A-D and the source/drain structures 21E (see FIG. 1L) of the N-FinFET device 10N. Importantly, using the methods disclosed herein, the fin structures 21A-D and the source/drain structures 21E (see FIG. 1L) of the N-FinFET device 10N are formed in a first common epitaxial deposition process that is performed to form the semiconducting material layer 21. As noted above, the thickness of the substantially un-doped layer of semiconducting material 21 will generally correspond to the thickness 17T of the first masking layer 17.

FIG. 2E depicts the product 100 after additional process operations have been performed. First, a second masking layer 17-2, having a thickness 17T2, e.g., about 10-20 nm, was formed above the first masking layer 17. Thereafter, a plurality of openings 17X-Z are formed through both the first and second masking layers 17, 17-2 using traditional photolithography and etching processes. The openings 17X-Z expose portions of the underlying substrate 12. In this example, the axial length (not shown) of the trenches 17X-Y is the same as the axial length 17L (see FIG. 1F) of the trenches 17A-D, although they may have different axial lengths if desired. In this particular example, the trenches 17X, 17Z have the same width, while the trench 17Y is wider than both of the trenches 17X, 17Z. The width of the trenches 17X-Z will correspond to the width of the fin structures of the P-FinFET device 10P, and the width of the fin structures may vary depending upon the device under construction. The height of the fin structures of the P-FinFET device 10P will be approximately determined by the combined thicknesses of the first and second masking layers 17, 17-2. FIG. 2F shows regions or trenches 33 formed in the combined masking layers 17, 17-2 where the source/drain structures will be formed for the P-FinFET device 10P. The width of the regions 33 may vary depending upon the particular application.

FIGS. 2G and 2H depict the product 100 after another substantially un-doped or low-doped layer of semiconducting material 31, e.g., un-doped epi silicon, has been formed above the portions or regions of the substrate exposed by the openings or trenches 17X-Z and 33 and after another CMP process has been performed to planarize the semiconducting material layer 31 with the upper surface of the second masking layer 17-2. These process operations result in the formation of the fin structures 31A-C and the source/drain structures 31E (see FIG. 2H) for the P-FinFET device 10P. Importantly, using the methods disclosed herein, the fin structures 31A-C and the source/drain structures 31E of the P-FinFET device 10P are formed in a second common epitaxial deposition process when the semiconducting material layer 31 is formed. As noted above, the thickness of the substantially un-doped layer of semiconducting material 31 will generally correspond to the combined thicknesses of the first and second masking layers 17, 17-2. The semiconducting material layer 31 may be comprised of the same or different materials than that of the semiconducting material layer 21 and it may have the same un-doped characteristics as that of the layer 21.

FIGS. 2I and 2J depict the product 100 after several process operations have been performed. First, the above-described etch-back process may be performed on the masking layers 17, 17-2 so as to remove the layer 17-2 while leaving portions of the post-etch layer 17PE in position so as to serve as isolation material between the substrate 12 and gate electrodes for the N-FinFET device 10N and the P-FinFET device 10P. Thereafter, after illustrative gate structures 25N, 25P were formed for the N-FinFET device 10N and the P-FinFET device 10P, respectively. An illustrative a gate cap layer 27 was also formed above the gate structures 25N, 25P. As will be recognized by those skilled in the art after a complete reading of the present application, the gate structures 25N, 25P depicted in the drawings, i.e., the gate insulation layers 25AN, 25AP and the gate electrodes 25BN, 25BP, are intended to be representative in nature. Moreover, the gate structures 25N, 25P may be comprised of the same or different materials. For example, the gate insulation layers 25N, 25P may be comprised of a variety of different materials, such as, for example, silicon dioxide, a high-k (k greater than 10) dielectric material (where k is the relative dielectric constant), etc. The gate electrodes 25BN, 25BP may be comprised or one or more layers of conductive material, e.g., doped polysilicon, one or more layers of metal, a metal nitride, etc. The gate structures 25N, 25P may be formed using either "gate-first" or "replacement gate" (also known as "gate-last") techniques. The gate cap layers 27 may be comprised of a variety of different materials, e.g., silicon nitride, silicon dioxide, etc. The gate structures 25N, 25P and the gate cap layers 27 may be formed as previously described above for the gate structure 25. At this point, traditional manufacturing techniques may be performed to complete the manufacture of the product 100, e.g., the formation of insulation layers, conductive contacts, metal silicide regions, metallization layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a FinFET device comprised of at least one fin structure and a plurality of source/drain structures, the method comprising:

forming a masking layer having an initial thickness above a semiconducting substrate, said masking layer exposing a first exposed region of said semiconducting substrate where said at least one fin structure will be formed and a plurality of second exposed regions where said plurality of source/drain structures will be formed;

with said masking layer in position, performing an epitaxial growth process to form a layer of semiconducting material on said first and second exposed regions of said semiconducting substrate to thereby form said at least one fin structure and said plurality of source/drain structures;

performing a chemical mechanical planarization process to planarize an upper surface of said layer of semiconducting material with an upper surface of said masking layer;

after performing said chemical mechanical planarization process, performing a process operation to reduce said initial thickness of said masking layer;

forming a gate insulation layer around at least a portion of said at least one fin structure; and forming a gate electrode above said gate insulation layer.

2. The method of claim 1, wherein said layer of semiconducting material is a continuous layer of material.

3. The method of claim 1, wherein said layer of semiconducting material is a layer of epitaxially deposited substantially un-doped silicon.

4. The method of claim 1, wherein a height of said at least one fin structure and a thickness of said plurality of source/drain structures corresponds approximately to a thickness of said masking layer.

5. A method of forming a FinFET device comprised of at least first and second fin structures and a plurality of source/drain structures, wherein said first fin structure has a width that is different than a width of said second fin structure, the method comprising:
  forming a masking layer having an initial thickness above a semiconducting substrate, said masking layer exposing a first exposed region of said semiconducting substrate where said first fin structure will be formed, a second region of said semiconducting substrate where said second fin structure will be formed and a plurality of third exposed regions of said semiconducting substrate where said plurality of source/drain structures will be formed, said first and second exposed regions having different widths;
  with said masking layer in position, performing an epitaxial growth process to form a layer of semiconducting material on said first, second and third exposed regions of said semiconducting substrate;
  performing a process operation to reduce said initial thickness of said masking layer;
  forming a first gate insulation layer around at least a portion of said first fin structure;
  forming a second gate insulation layer around at least a portion of said second fin structure;
  forming a first gate electrode above said first gate insulation layer; and
  forming a second gate electrode above said second gate insulation layer.

6. The method of claim 5, wherein said layer of semiconducting material is a continuous layer of material.

7. The method of claim 5, wherein, prior to performing said process operation to reduce said initial thickness of said masking layer, performing a chemical mechanical planarization process to planarize an upper surface of said layer of semiconducting material with an upper surface of said masking layer.

8. The method of claim 5, wherein said layer of semiconducting material is a layer of epitaxially deposited substantially un-doped silicon.

9. The method of claim 5, wherein a height of each of said first and second fin structures and a thickness of said plurality of source/drain structures corresponds approximately to said initial thickness of said masking layer.

10. A method of forming first and second FinFET devices above first and second portions of a semiconducting substrate, respectively, the first FinFET device comprising at least one first fin structure and a plurality of first source/drain structures, the second FinFET device comprising at least one second fin structure and a plurality of second source/drain structures, wherein said at least one first fin structure has a first height and said at least one second fin structure has a second height, the first height being less than the second height, the method comprising:
  performing a first epitaxial growth process to form a first layer of semiconducting material on said first portion of said semiconducting substrate, wherein a first portion of said first layer of semiconducting material is said at least one first fin structure for said first FinFET device and wherein a plurality of second portions of said first layer of semiconducting material are said plurality of first source/drain structures of said first FinFET device;
  performing a second epitaxial growth process to form a second layer of semiconducting material on said second portion of said semiconducting substrate, wherein a first portion of said second layer of semiconducting material is said at least one second fin structure for said second FinFET device and wherein a plurality of second portions of said second layer of semiconducting material are said plurality of second source/drain structures of said second FinFET device;
  forming a first gate insulation layer around at least a portion of said at least one first fin structure;
  forming a second gate insulation layer around at least a portion of said at least one second fin structure;
  forming a first gate electrode above said first gate insulation layer; and
  forming a second gate electrode above said second gate insulation layer.

11. The method of claim 10, wherein said first and second fin structures have different fin widths.

12. The method of claim 10, wherein performing said first epitaxial growth process comprises performing said first epitaxial growth process through a first masking layer formed above said semiconducting substrate.

13. The method of claim 12, wherein a height of said at least one first fin structure and a thickness of said first plurality of source/drain structures corresponds approximately to a thickness of said first masking layer.

14. The method of claim 12, wherein performing said second epitaxial growth process comprises performing said second epitaxial growth process through said first masking layer and a second masking layer formed above said first masking layer.

15. The method of claim 14, wherein a height of said at least one second fin structure and a thickness of said second plurality of source/drain structures corresponds approximately to a combined thickness of said first and second masking layers.

16. A method of forming first and second FinFET devices above first and second portions of a semiconducting substrate, the first FinFET device comprising at least one first fin structure, the second FinFET device comprising at least one second fin structure, wherein said at least one first fin structure has a first height and said at least one second fin structure has a second height, the first height being less than the second height, the method comprising:
  forming a first masking layer having a first initial thickness above said first and second portions of said semiconducting substrate, said first masking layer covering said second portion of said semiconducting substrate while exposing a first exposed region of said first portion of said semiconducting substrate where said at least one first fin structure will be formed;
  with said first masking layer in position, performing a first epitaxial growth process to form a first layer of semiconducting material on said first exposed region of said first portion of said semiconducting substrate to thereby define said at least one first fin structure having said first fin height;
  forming a second masking layer having a second initial thickness above said first masking layer and above said first and second portions of said semiconducting substrate;
  forming at least one opening through said first and second masking layers positioned above said second portion of said substrate so as to expose a first exposed region of said second portion of said semiconducting substrate where said at least one second fin structure will be formed;

with said first and second masking layers in position, performing a second epitaxial growth process to form a second layer of semiconducting material on said first exposed region of said second portion of said semiconducting substrate to thereby define said at least one second fin structure having said second fin height; and performing at least one process operation to remove said second masking layer and to reduce said initial thickness of said first masking layer.

17. The method of claim 16, further comprising forming a first gate insulation layer around at least a portion of said first fin structure and forming a first gate electrode above said first gate insulation layer.

18. The method of claim 16, further comprising forming a second gate insulation layer around at least a portion of said second fin structure and forming a second gate electrode above said second gate insulation layer.

19. The method of claim 16, wherein said first and second FinFET devices are different types of FinFET devices.

20. The method of claim 16, wherein said first and second FinFET devices are the same type of FinFET devices.

21. The method of claim 16, wherein said first and second fin structures have different fin widths.

22. The method of claim 16, wherein a height of said at least one first fin structure corresponds approximately to a thickness of said first masking layer.

23. The method of claim 22, wherein a height of said at least one second fin structure corresponds approximately to a combined thickness of said first and second initial thicknesses of said first and second masking layers.

24. The method of claim 16, wherein, prior to forming said second masking layer, the method further comprises performing a chemical mechanical polishing process to planarize an upper surface of said first semiconducting material layer with an upper surface of said first masking layer.

25. A method of forming first and second FinFET devices above first and second portions of a semiconducting substrate, the first FinFET device comprising at least one first fin structure and a plurality of first source/drain structures, the second FinFET device comprising at least one second fin structure and a plurality of second source/drain structures, wherein said at least one first fin structure has a first height and said at least one second fin structure has a second height, the first height being less than the second height, the method comprising:

forming a first masking layer having a first initial thickness above said first and second portions of said semiconducting substrate, said first masking layer covering said second portion of said semiconducting substrate while exposing a first exposed region of said first portion of said semiconducting substrate where said at least one first fin structure will be formed and a plurality of second exposed regions of said first portion of said semiconducting substrate where said plurality of first source/drain structures will be formed;

with said first masking layer in position, performing a first epitaxial growth process to form a first layer of semiconducting material on said first and second exposed regions of said first portion of said semiconducting substrate to thereby define said at least one first fin structure having said first fin height and said plurality of first source/drain structures;

forming a second masking layer above said first masking layer and above said first and second portions of said semiconducting substrate, said second masking layer having a second initial thickness;

forming at least one opening through said first and second masking layers positioned above said second portion of said semiconducting substrate so as to expose a first exposed region of said second portion of said semiconducting substrate where said at least one second fin structure will be formed and a plurality of second exposed regions of said second portion of said semiconducting substrate where said plurality of second source/drain structures will be formed;

with said first and second masking layers in position, performing a second epitaxial growth process to form a second layer of semiconducting material on said first and second exposed regions of said second portion of said semiconducting substrate to thereby define said at least one second fin structure having said second fin height and said plurality of second source/drain structures; and performing at least one process operation to remove said second masking layer and to reduce said initial thickness of said first masking layer.

26. The method of claim 25, wherein said first and second fin structures have different fin widths.

27. The method of claim 25, wherein a height of said at least one first fin structure and a thickness of said first plurality of source/drain structures corresponds approximately to a thickness of said first masking layer.

28. The method of claim 27, wherein a height of said at least one second fin structure and a thickness of said second plurality of source/drain structures corresponds approximately to a combined thickness of said first and second initial thicknesses of said first and second masking layers.

* * * * *